Figure 1:
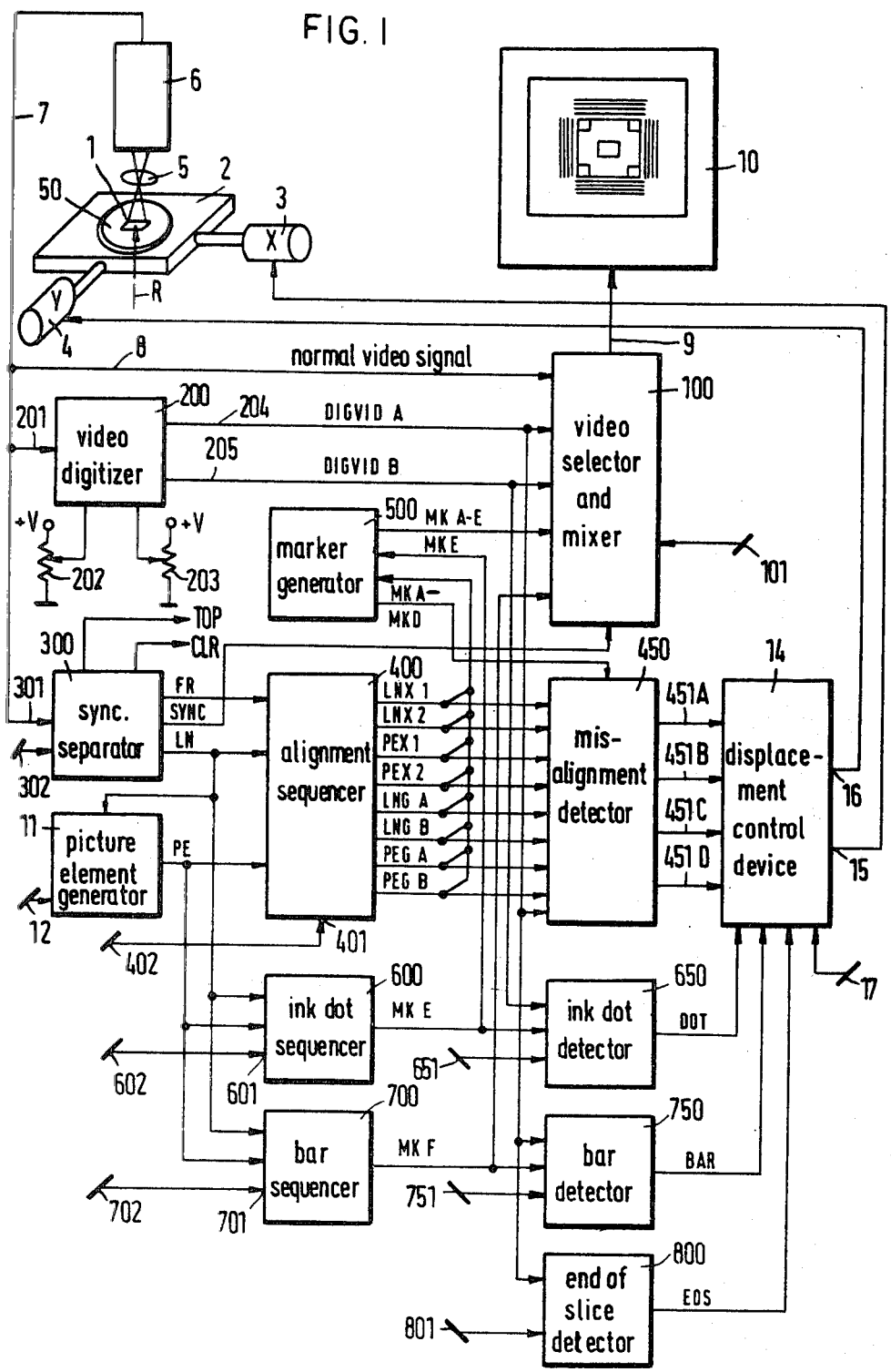

United States Patent [19]

Guth

[11] 4,352,125
[45] Sep. 28, 1982

[54] RECOGNITION APPARATUS

[75] Inventor: Friedrich Guth, Freising, Fed. Rep. of Germany

[73] Assignee: Texas Instruments Deutschland GmbH, Freising, Fed. Rep. of Germany

[21] Appl. No.: 115,659

[22] Filed: Jan. 28, 1980

Related U.S. Application Data

[62] Division of Ser. No. 948,064, Nov. 29, 1978, abandoned.

[30] Foreign Application Priority Data

Jan. 27, 1978 [DE] Fed. Rep. of Germany ....... 2803653

[51] Int. Cl.³ ........................................... H04N 7/18
[52] U.S. Cl. ..................................... 358/101; 358/106
[58] Field of Search ................. 358/93, 101, 106, 107; 364/481, 488, 491, 507

[56] References Cited

U.S. PATENT DOCUMENTS

| 3,870,814 | 3/1975 | Woods et al. | 178/7.2 |
| 4,041,286 | 9/1977 | Sanford | 235/151.3 |
| 4,238,780 | 12/1980 | Doemens | 358/101 |
| 4,253,111 | 2/1981 | Funk | 358/101 |

FOREIGN PATENT DOCUMENTS 1465293 2/1977 United Kingdom .
1510351 5/1978 United Kingdom .

*Primary Examiner*—Michael A. Masinick
*Attorney, Agent, or Firm*—N. Rhys Merrett; Melvin Sharp; Gary Honeycutt

[57] ABSTRACT

A matrix array of objects, for example, semiconductor bars, is located on a carrier such as an XY table and the objects are successively brought into the field of view of a television camera to produce digitized video signals which are utilized in effecting precise alignment of the object with respect to a reference point. Following this alignment step, an electronic analysis is made, again on the basis of digitized video signals, to confirm the presence of an object in the aligned position, and that the object is complete. In the event a complete object is determined to be present in the aligned position, further analysis may be made, also on the basis of digitized video signals to determine whether the object has a surface identification mark indicating that the object is a reject.

12 Claims, 17 Drawing Figures

RECOGNITION APPARATUS

This is a division of application Ser. No. 948,064 filed Nov. 29, 1978 now abandoned and now continued as application Ser. No. 164,717 filed June 30, 1980, the description of which is incorporated herein by reference, which describes and claims apparatus for aligning an object with respect to a reference position.

The present invention relates to apparatus for recognizing the presence of an identification area, or of an object, on a background surface.

Such apparatus is useful in the production of semiconductor devices such as transistors or integrated circuits which are made in the form of small rectangular wafers, called "bars" in large quantities and must then be mounted and provided with connections.

The above identified co-pending application Ser. No. 948,064 discloses an apparatus capable of accurate alignment of semiconductor devices with respect to a predetermined refernce position. It is advantageous to provide for automatic recognition of the presence of a semiconductor device following the alignment operation.

Accordingly, in one aspect, the invention provides apparatus for recognizing the presence of an object disposed in the field of view of a television camera on a background surface. The television camera is operable to generate an electrical video signal representative of a video image of a surface of the object and of said background surface within the field of view of the television camera. Digitizing means receives the video signals and forms therefrom digital video signals of two signal levels which for video signals originating from the object surface have predominantly a first signal level and for video signals originating from the background surface area have the second level. Marker generator means is operable under control of control signals for generating marker signals to define the boundaries of the intervals corresponding to at least one marker field lying within the area of the video image of said object. Analyzing means analyzes the digital video signals at predetermined instants during the intervals corresponding to said at least one marker field for producing a pulse in each case when the analyzed digital video signal has the first signal level. The pulses are counted and a signal indicating the presence or completeness of the object is furnished whenever the count exceeds a predetermined value during a complete analysis of said at least one marker field.

For it is usual to to check the semiconductor devices after their formation but prior to assembly for usability and to mark all the bars which do not fulfil the requirements for the further processing at a predetermined location with an ink dot whose reflection properties clearly differ from those of the bar surfaces so that it may be distinguished in a video image displayed on the screen of a monitor, for example as a dark area against the bright background of the bar surface.

In another aspect, the invention provides an apparatus capable of operation to provide automatic recognition of the presence of an ink dot or similar marker.

According to the invention, an apparatus for recognizing the presence of an identification area having a first reflection characteristic on a background surface of an object having a different second reflection characteristic, comprises a television camera operable to generate an electrical video signal representative of a surface area of the object containing the identification area; digitizing means which receives the video signals and forms therefrom digital video signals having two signal levels which for the video signals originating from the background area have predominantly a first signal level and for the video signals originating from the identification area have predominantly a second signal level, marker generator means operable under control of control signals for generating marker signals which define the boundaries of a predetermined number of intervals provided for analysis of said digital video signals; means which analyses the digital video signals at a predetermined number of instants during said intervals and generates a pulse in each case when the analysed video signal has the second signal level, and means which counts the pulses and furnishes a signal indicating the presence of the identification area whenever the count exceeds a predetermined value during a complete analysis.

Figure 2:
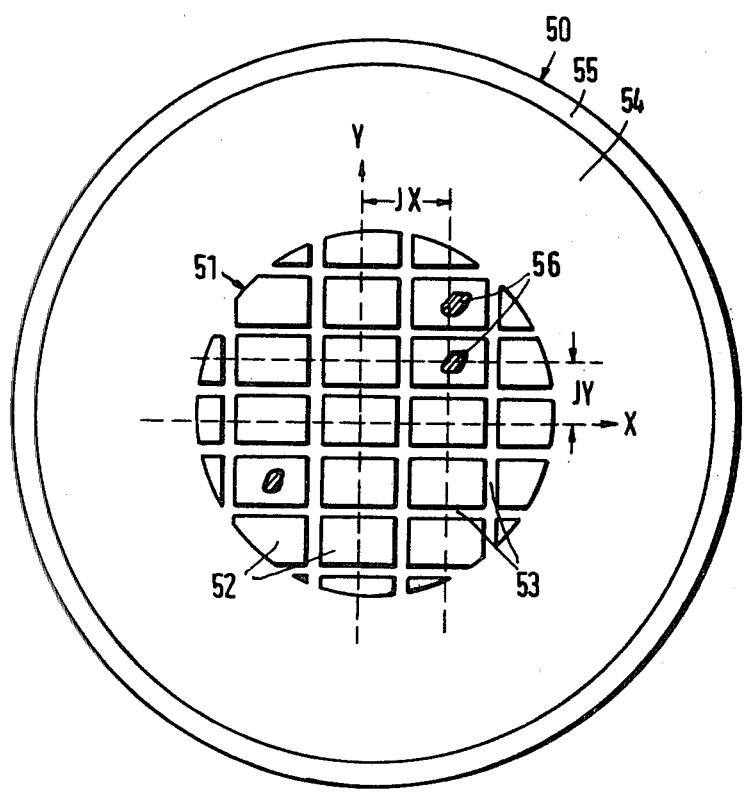
Figure 3:
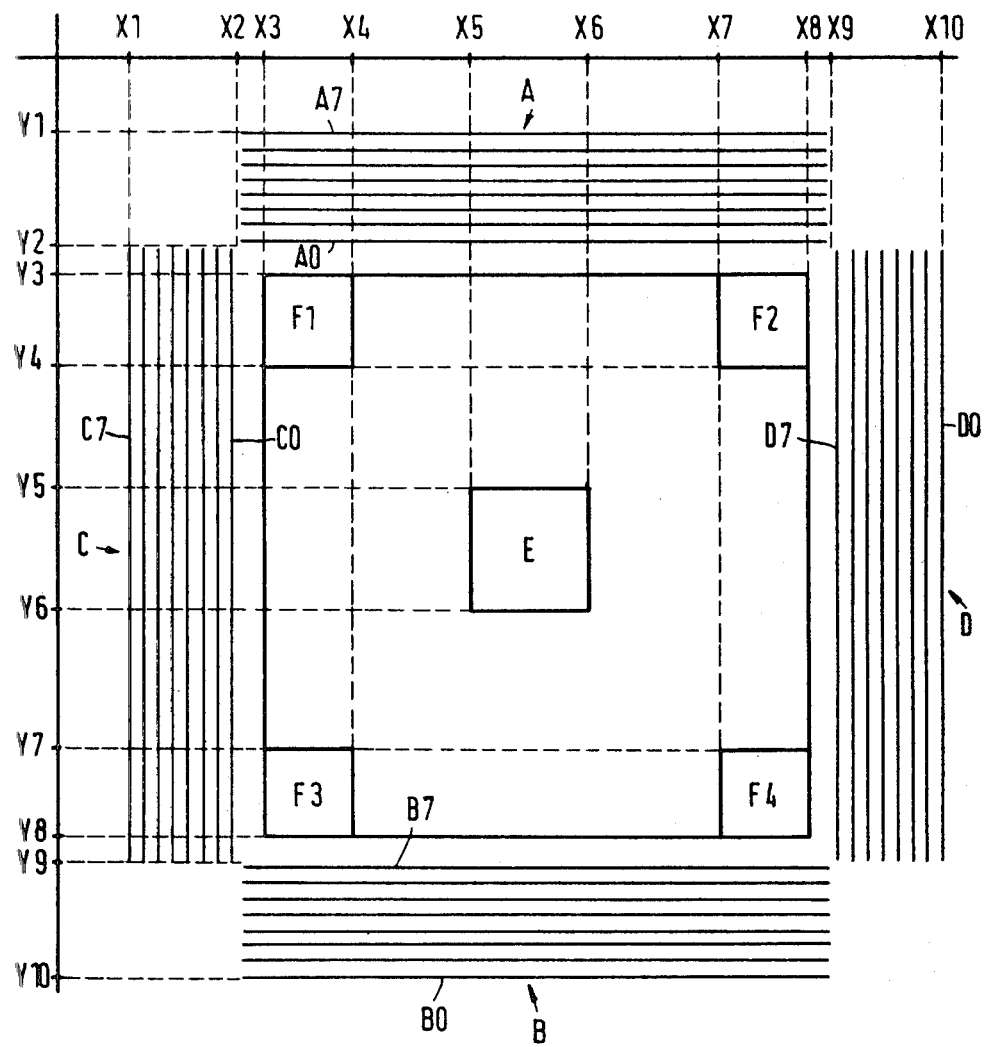
Figure 4A:
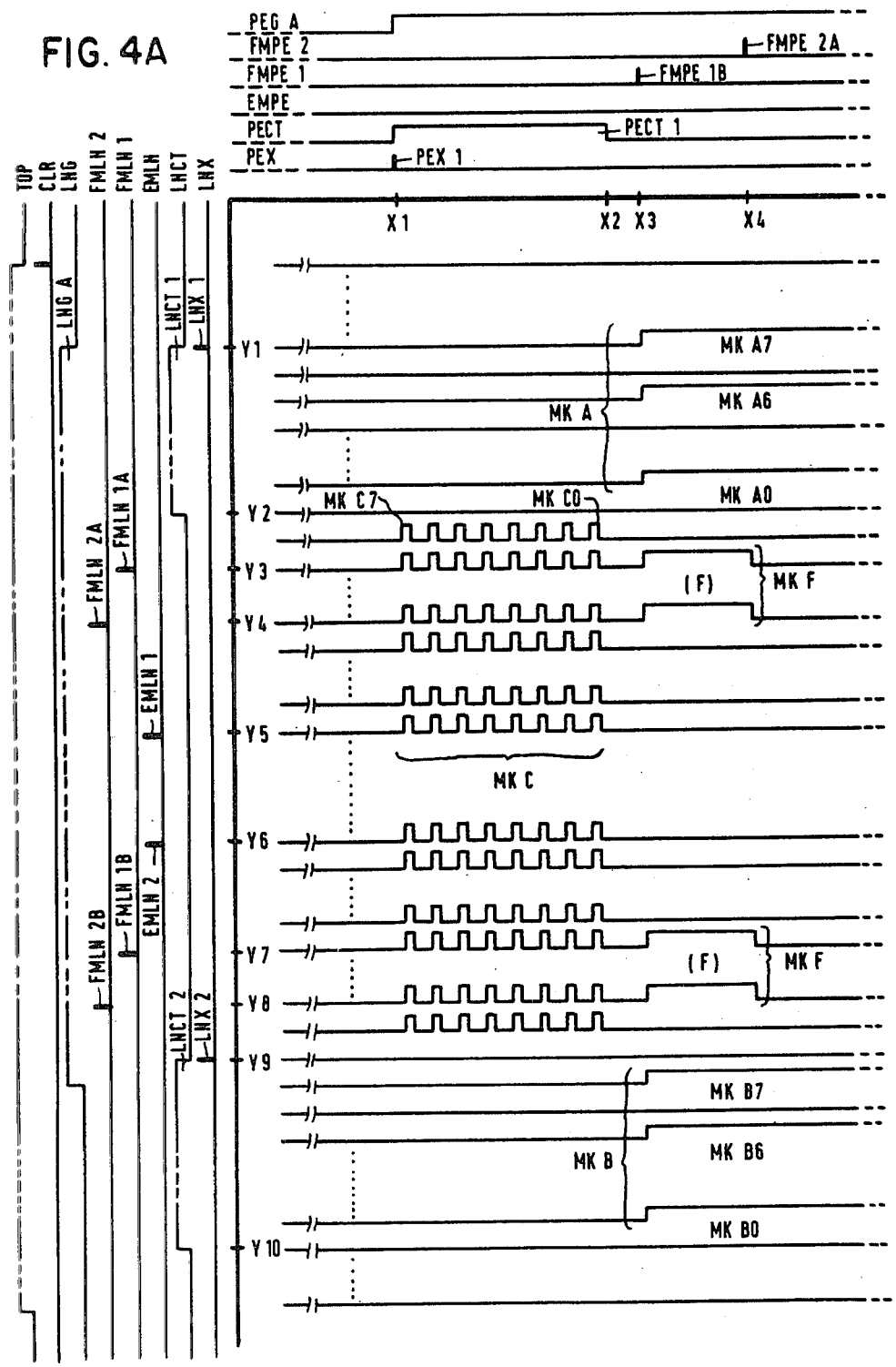
Figure 4B:
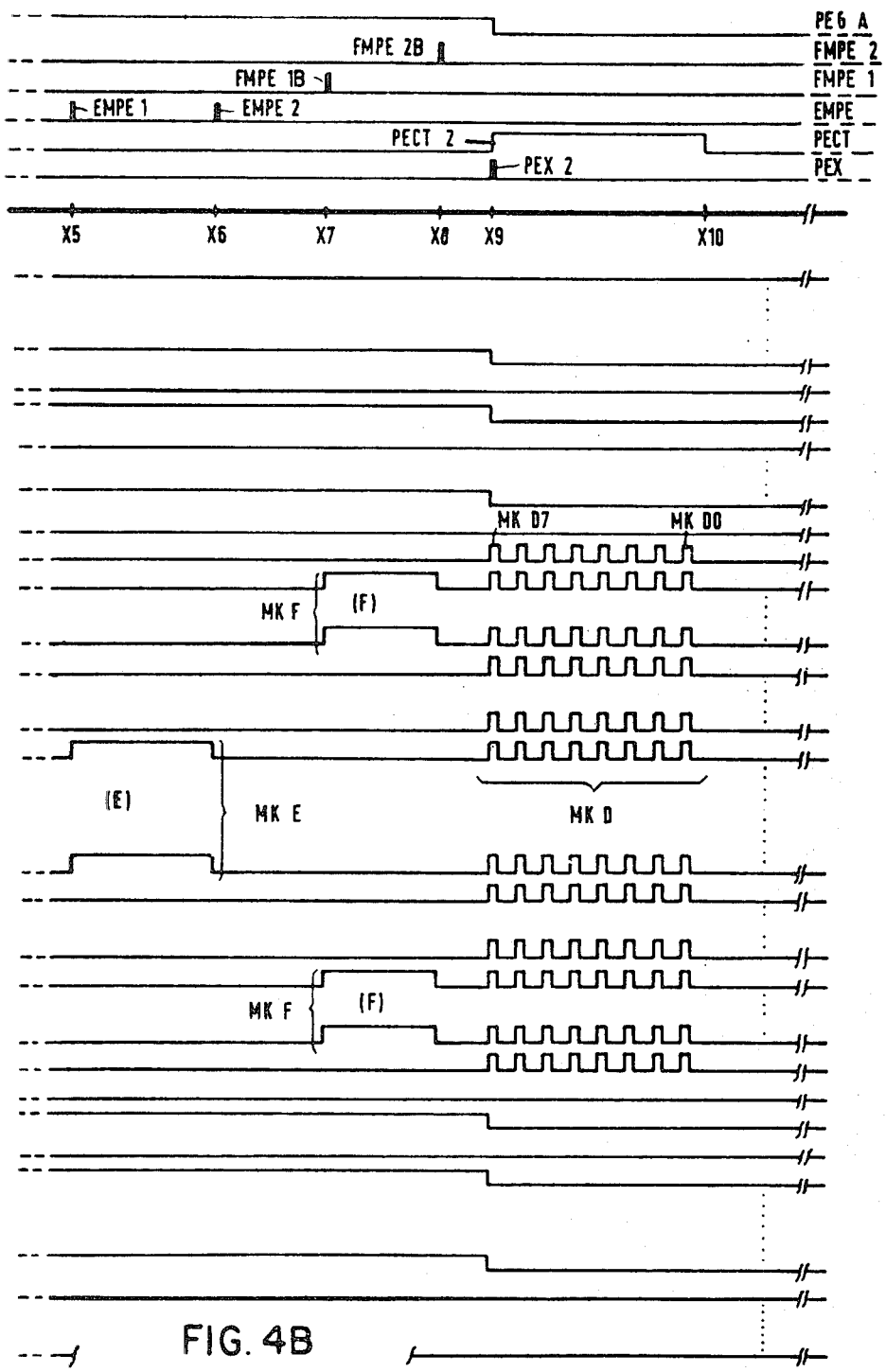
Figure 5:
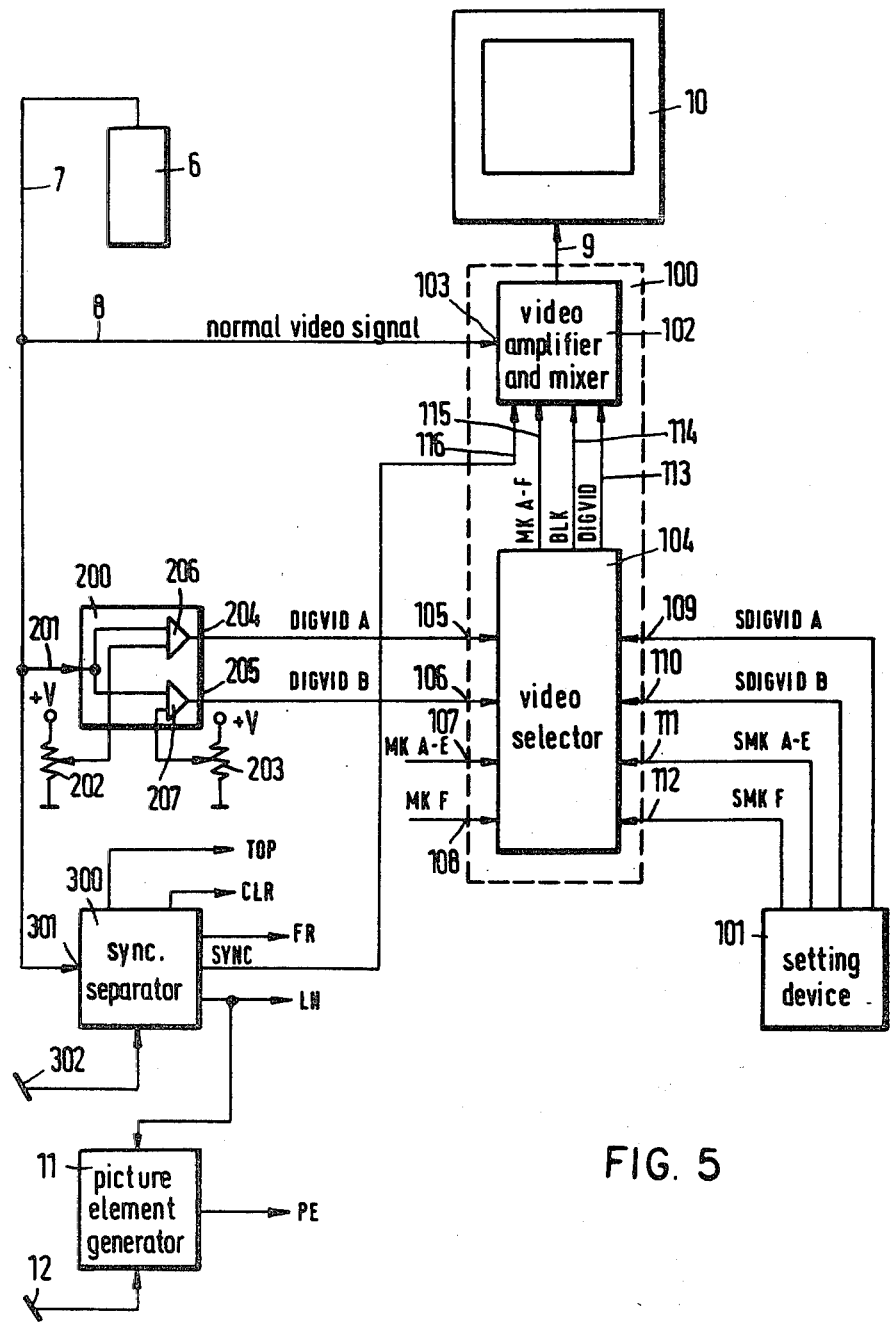
Figure 6:
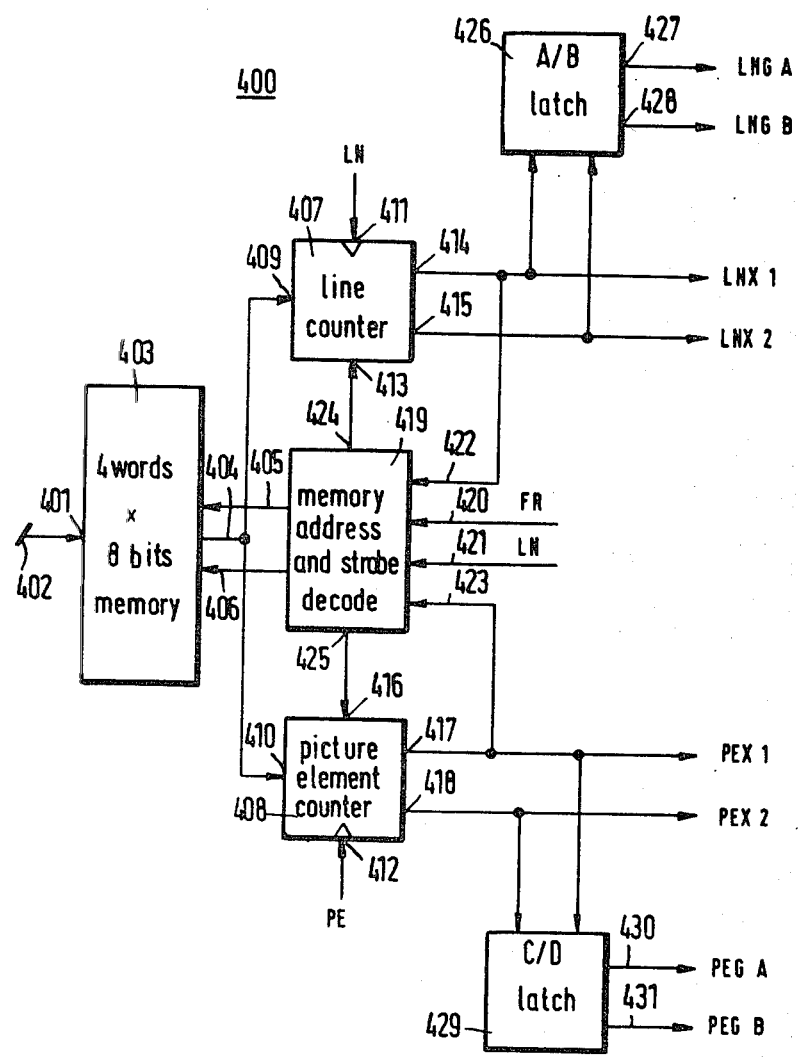
Figure 7:
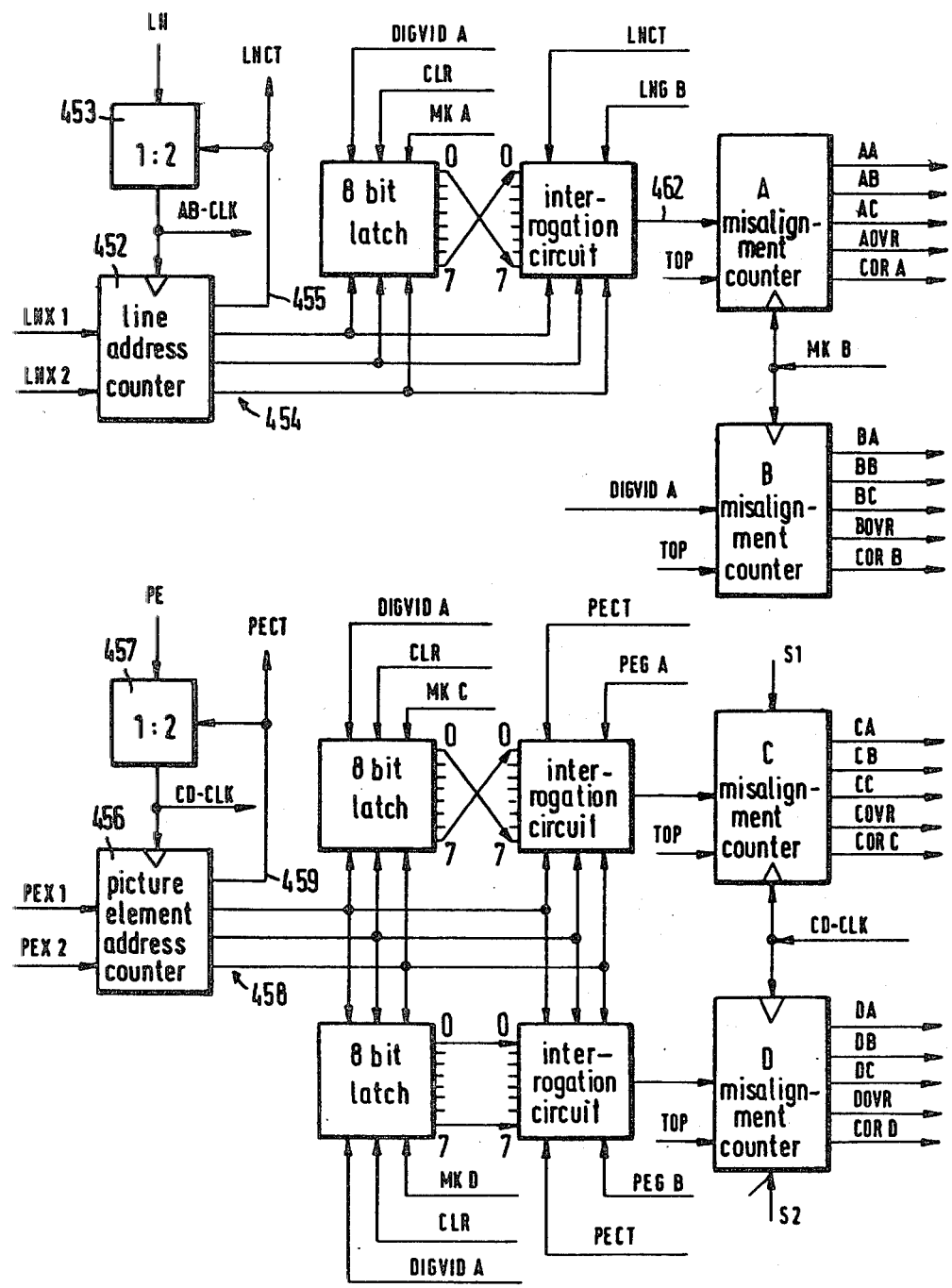
Figure 8:
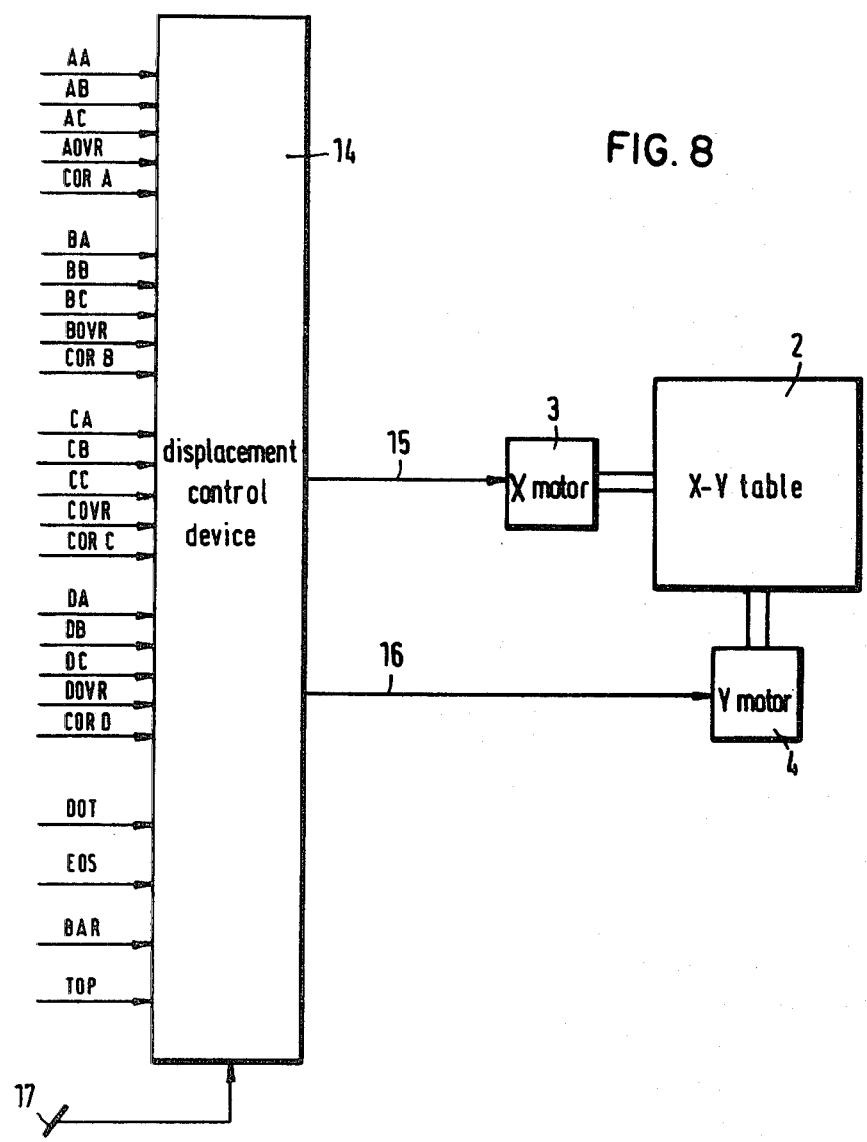
Figure 9:
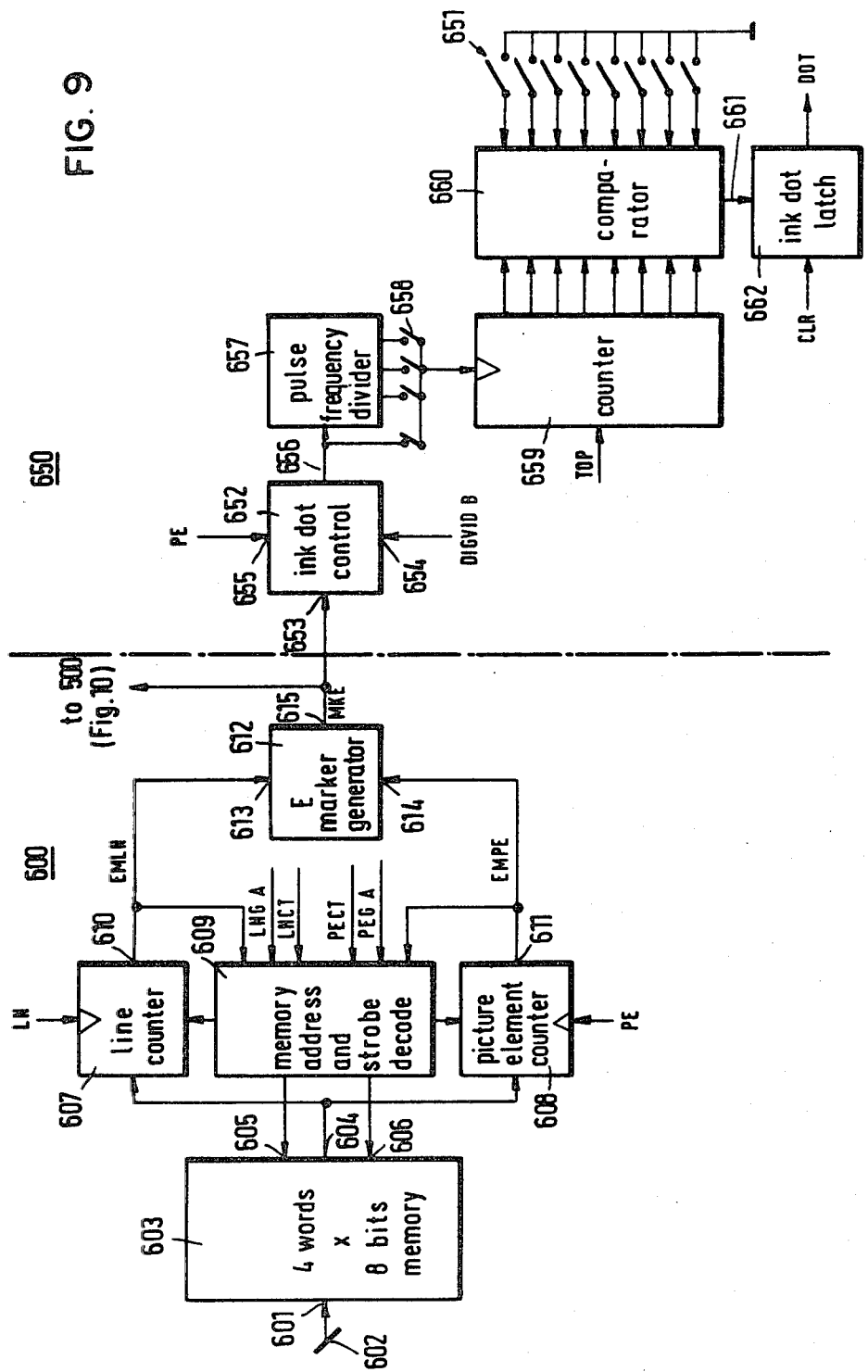
Figure 10:
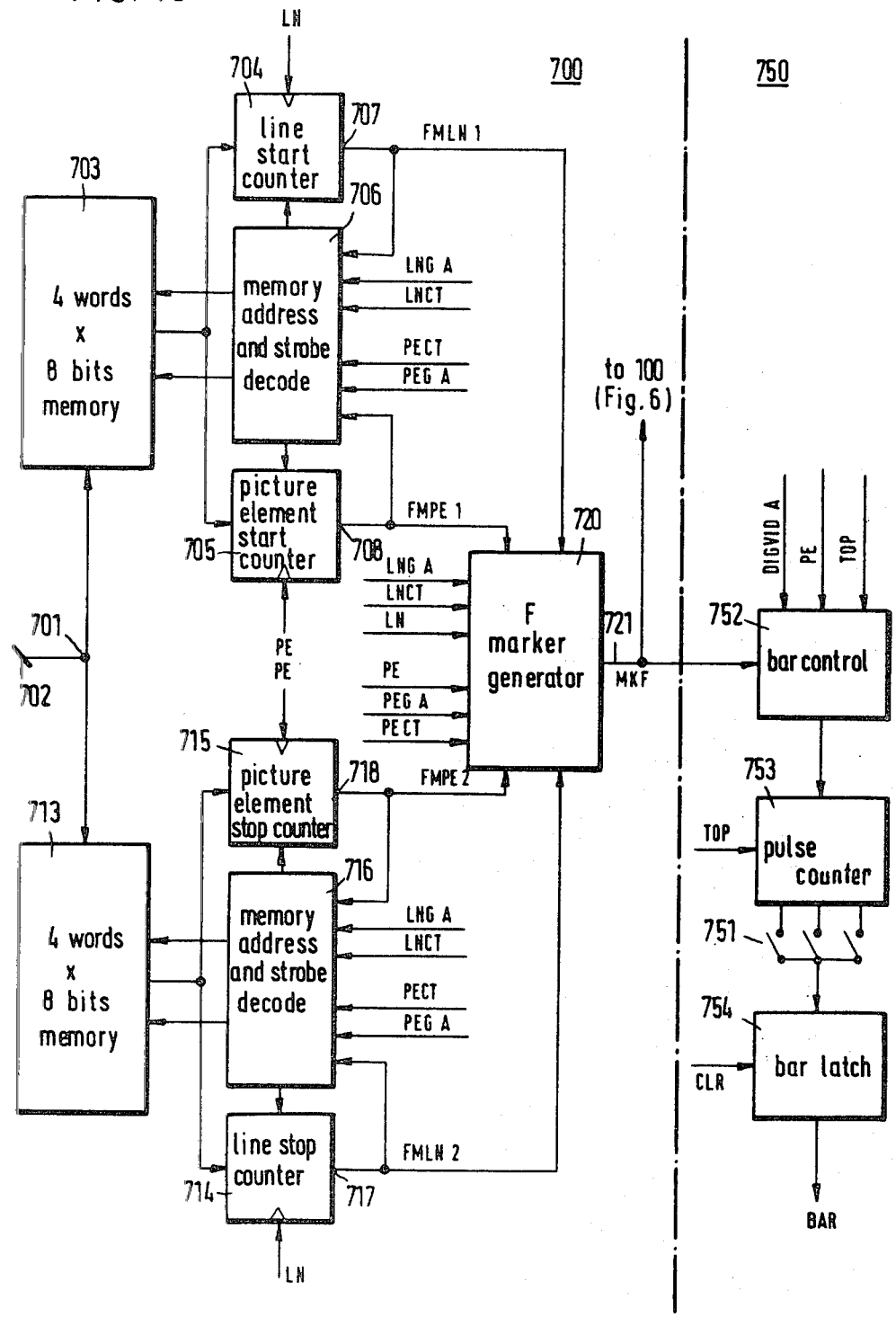
Figure 11:
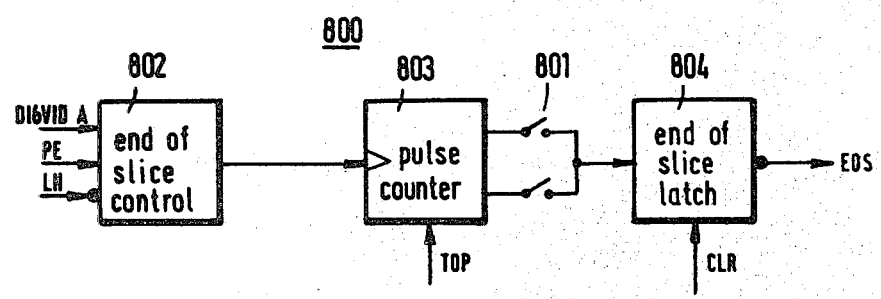
Figure 12:
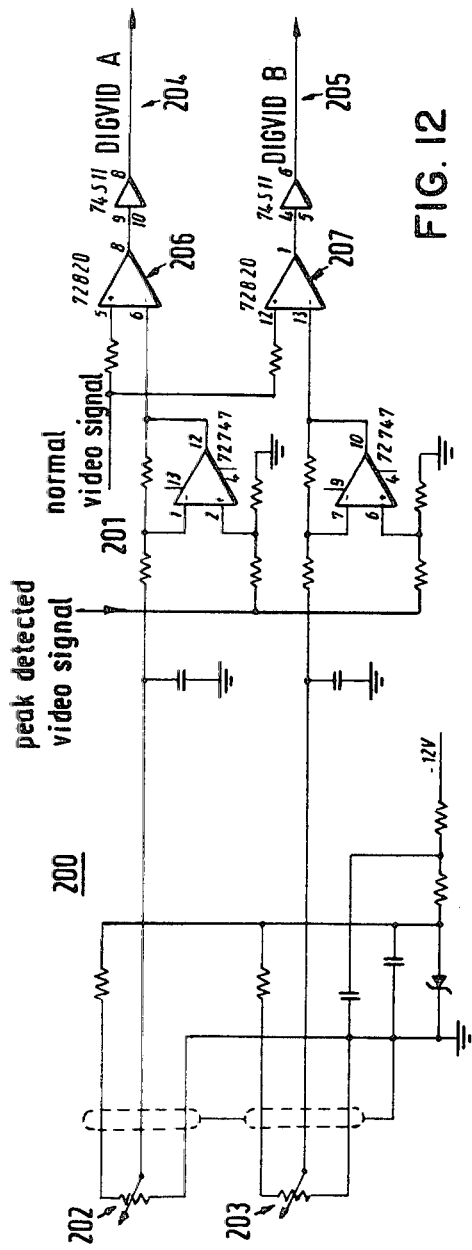
Figure 13:
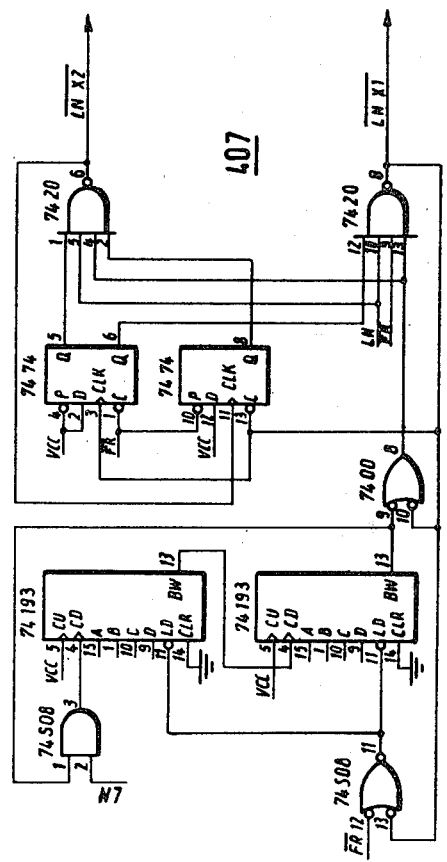
Figure 14:
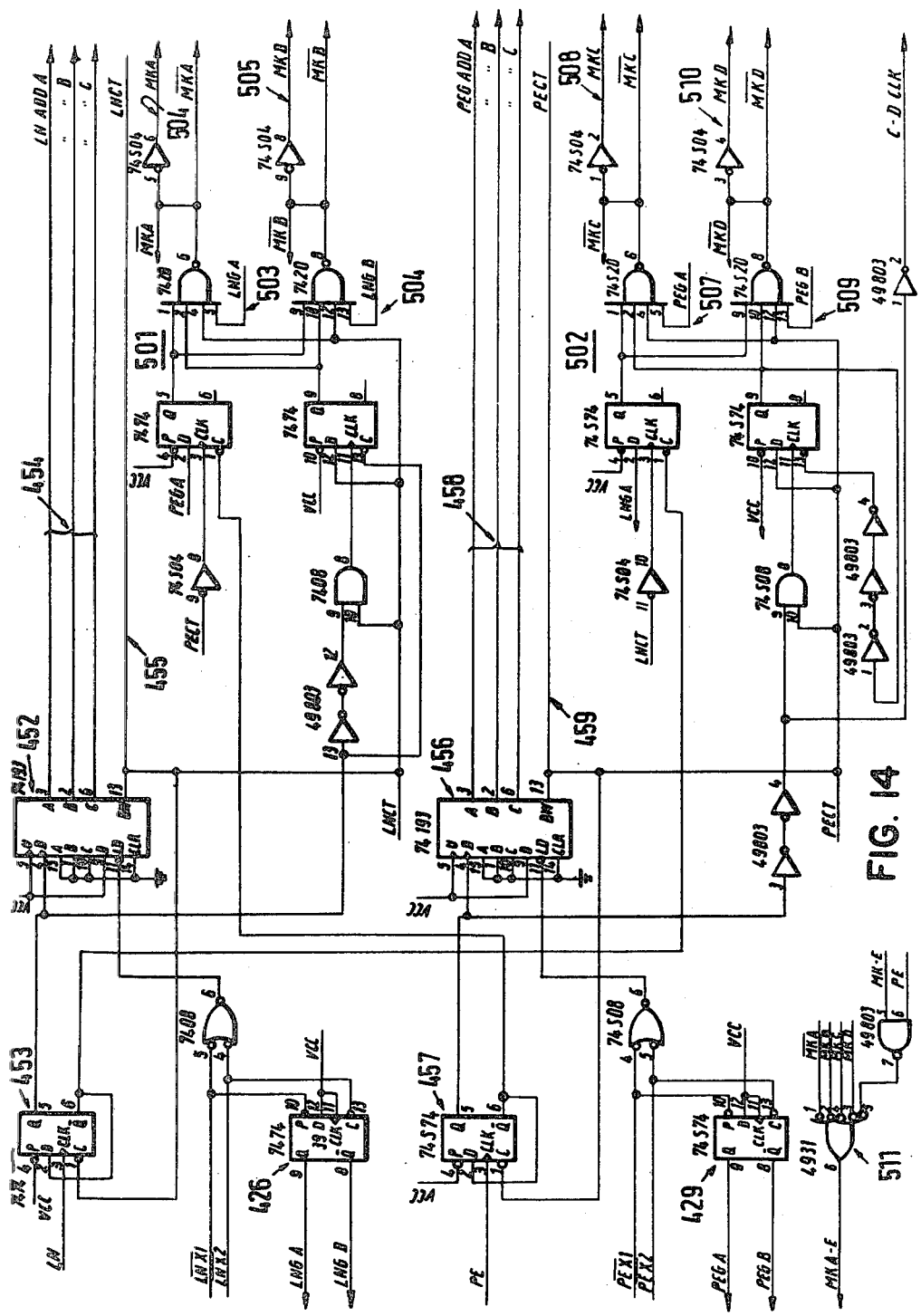
Figure 15:
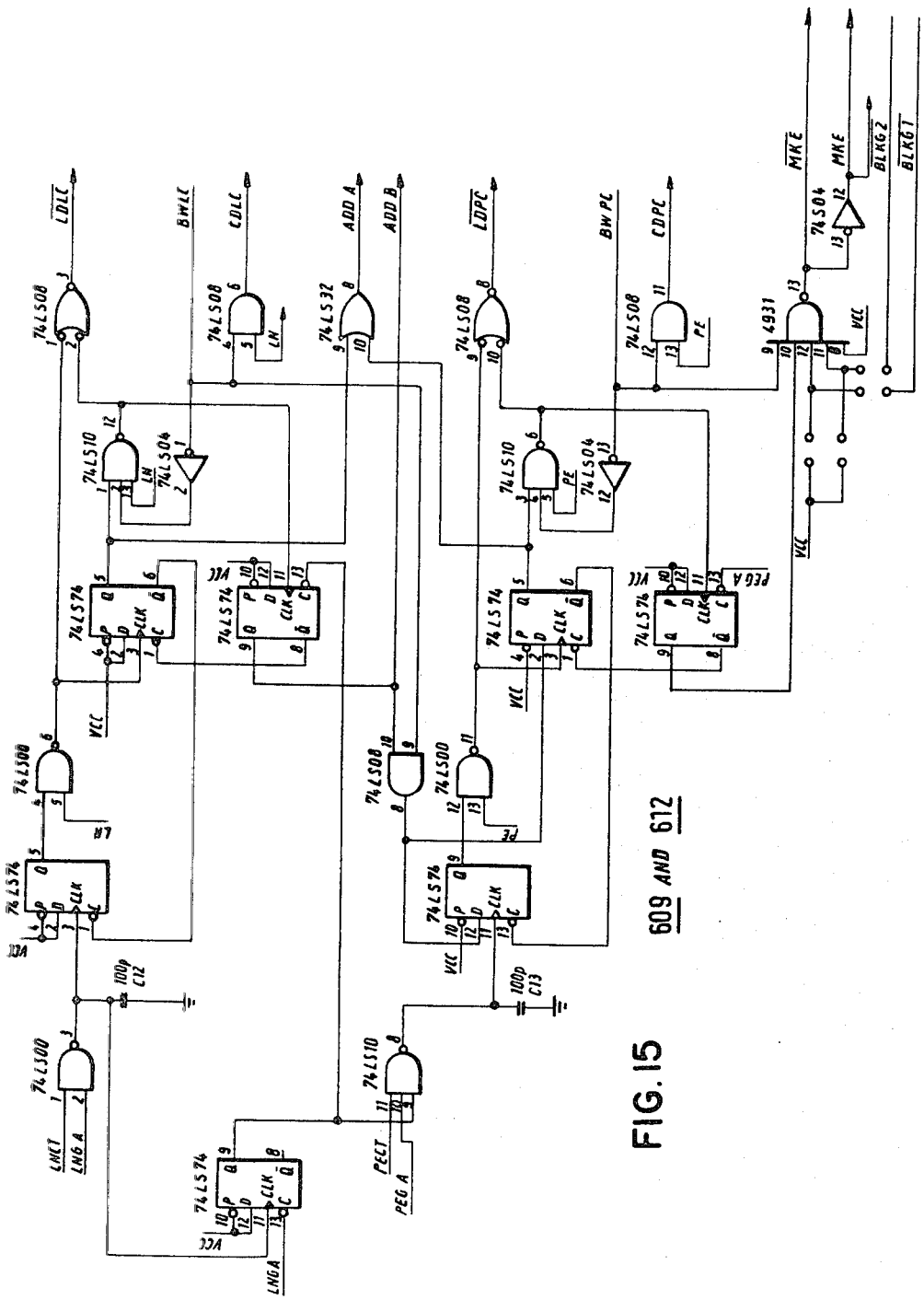
Figure 16:
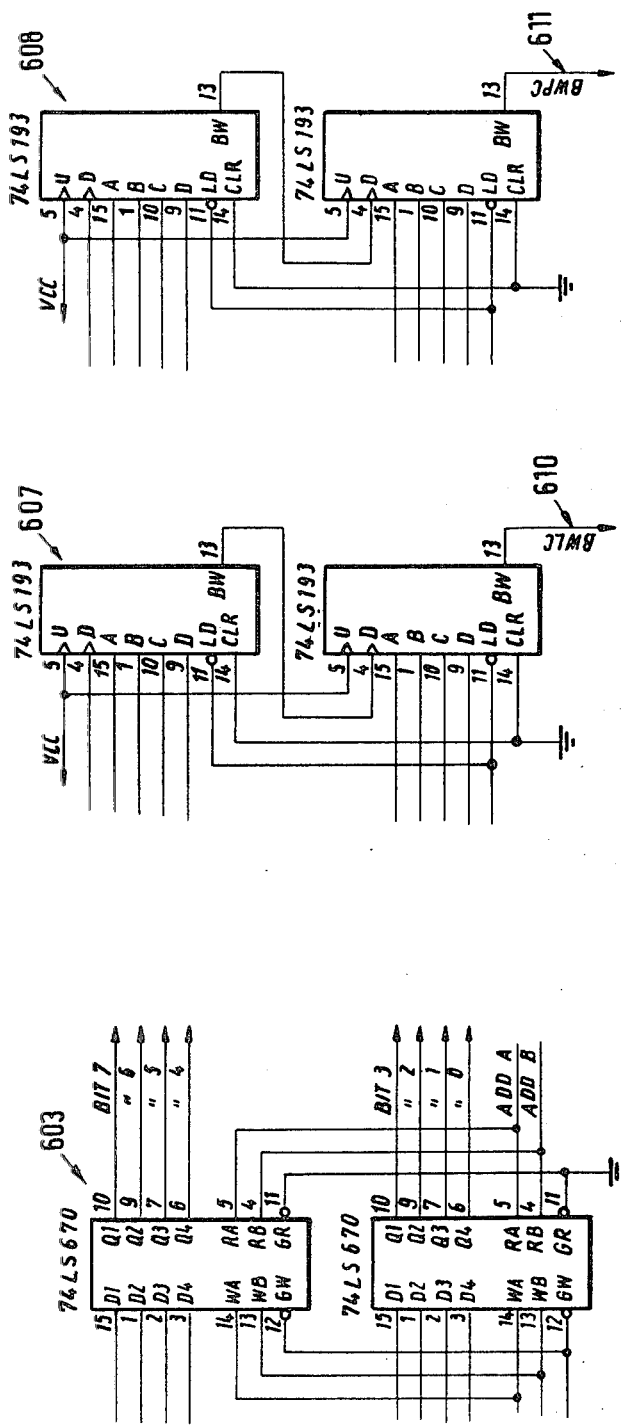

Further features and advantages of the invention will be apparent from the following description of an example of embodiment with the aid of the drawings, wherein:

FIG. 1 is a block diagram of an alignment and recognition apparatus embodying the invention, FIG. 2 shows a carrier with semiconductor bars as example of objects which can be aligned with the apparatus of FIG. 1, FIG. 3 shows the markers produced on the screen with the apparatus of FIG. 1, FIGS. 4A and 4B together are time diagrams of signals generated in the apparatus of FIG. 1, FIG. 5 is a more detailed circuit diagram of some components of the apparatus of FIG. 1, FIG. 6 is a more detailed circuit diagram of the alignment sequencer, FIG. 7 is a more detailed circuit diagram of the misalignment detector, FIG. 8 is a block diagram of the displacement control device and an error detector, FIG. 9 is a more detailed circuit diagram of the ink dot sequencer and the ink dot detector, FIG. 10 is a more detailed circuit diagram of the bar sequencer and bar detector, FIG. 11 is a more detailed circuit diagram of the end of slice detector, FIG. 12 is the circuit diagram of a practical embodiment of the video digitizer, FIG. 13 is the circuit diagram of a practical embodiment of the line counter of the alignment sequencer, FIG. 14 is the circuit diagram of a practical embodiment of various components of the alignment sequencer, the misalignment detector and the marker generator, FIG. 15 is the circuit diagram of a practical embodiment of various components of the ink dot sequencer and FIG. 16 is the circuit diagram of a practical embodiment of further components of the ink dot sequencer.

The positioning and alignment apparatus illlustrated in FIG. 1 is intended to exactly align an object 1 in a horizontal plane with respect to a fixed reference point which is indicated by a vertical arrow R. For this purpose, the positioning and alignment apparatus comprises an X-Y table 2 on the top of which the object 1 is placed and which is adjustable by two motors 3 and 4 in two directions perpendicular to each other, which are denoted as X-direction and Y-direction. The motors 3 and 4 are preferably electrical stepping motors which on each step effect an exactly defined adjustment of the X-Y table 2 in the associated direction, which is for example 10 μm. The stepping motor 3 is the X motor and the stepping motor 4 is the Y motor.

The object 1 may for example be a workpiece on which during the production certain manipulations must be made for which the exact alignment with the reference point R is necessary. Since generally the mass processing of very small workpieces with identical dimensions is involved, a relatively large number of these workpieces may be placed on the X-Y table 2 simultaneously and then aligned successively with the reference point R.

A preferred field of application of the setting and alignment apparatus is the fabrication of semiconductor devices. In the latter, it is of course usual to produce a great number of devices, such as transistors or integrated circuits, simultaneously on a single semiconductor slice of small thickness and then to separate said slice into individual elements which have the shape of rectangular wafers which are called "bars". A large number of such bars is then arranged for example in the manner illustrated in FIG. 2 on a carrier 50.

FIG. 2 shows the originally circular semiconductor slice 51 on which is formed a large number of identical semiconductor devices 52 with rectangular outline. The semiconductor devices 52 all have the same size and are arranged in regular columns and rows. The semiconductor slice 51 is adhered to a support 54 which is for example a resilient plastic foil whose edge is clamped in a frame 55. The slice 51 is thereafter severed into individual bars 52, for example sawing along the edges of the bars 52, so that between the bars intermediate spaces 53 are formed in which the material of the support 54 is visible.

In FIG. 2 the size of the bars 52 is shown exaggerated relatively to the size of the semiconductor slice 51 and for this reason the number of bars in each row and column is only small. In reality the number of bars formed on a semiconductor slice may be very large and amount to several hundreds. Depending on the type of semiconductor device, the size of the bars may vary greatly, but the length of the edges is generally of the order of magnitude of a few millimeters.

As further apparent from FIG. 2 the bars lying at the edge of the slice, i.e. the last bars in each row and column, are generally incomplete and thus not usuable. It may also occur that a bar is incomplete or missing entirely within a row.

FIG. 2 also indicates a further step usual in the manufacture of semiconductor devices. After the formation of the semiconductor devices on the semiconductor slice 51, but prior to separating into the individual bars, the semiconductor devices are checked for usability. All bars which do not have the characteristics necessary for further processing are marked at a predetermined location with an ink dot 56 which is shown for some bars in FIG. 2. The ink dot covers a relatively large portion of the surface of the bar so as to be easily distinguished from other dark surface areas which may be present on a usable bar.

To conduct further manipulations on the bars 52 which require an exact alignment of each bar the carrier 50 is mounted on the X-Y table 2 (FIG. 1) and angularly aligned exactly so that the rows lie in the X-direction and the columns in the Y-direction. The X-Y table 2 is displaced stepwise in the Y-direction in such a manner that the bars of a row are brought successively into coincidence with the reference point R. For this purpose, the X stepping motor 3 is in each case driven for a number of steps which corresponds to a displacement of the X-Y table 2 by the distance JX between the centre points of two bars 52 in the X-direction (FIG. 2). After going through a complete row in this manner, the Y stepping motor 4 is actuated for a number of steps which corresponds to a displacement of the X-Y table 2 in the Y-direction by the amount JY between two bars 52; the next row is then run through in the opposite displacement direction.

However, this stepwise displacement of the X-Y table 2 gives only an approximate setting of the bars 52 to the reference point R; in particular, a displacement error can add up to a considerable amount for a large number of bars. For many manipulations it is however necessary for each individual bar to be aligned very accurately with the reference point R, for example so that its centre point (intersection of the diagonals) is in exact coincidence with the reference point R. This alignment is effected by the apparatus illustrated in FIG. 1 following the stepwise displacement of the X-Y table 2.

For this alignment operation the portion of the surface of the carrier 50 lying above the reference point R is projected by an objective 5 onto the photo cathode of a television camera 6. The magnification of the objective 5 is preferably adjustable to adapt to different bar sizes; for example, the magnifications 20:1, 40:1 and 80:1 may be provided. The magnification is chosen in each case so that apart from the bar to be aligned a considerable surrounding area is projected, containing for example several complete bars.

In addition to the stepwise changing of the magnification, the objective 5 is preferably also designed so that an infinitely variable adjustment of the magnification (zoom effect) is possible in each magnification range.

The television camera 6 may be a standard commercially available power line synchronizing camera operating with line interlacing which produces at its output line 7 the analog video signals representing the imaged area together with the frame and line synchronizing pulses necessary for the reproduction. These normal video signals are transmitted via a line 8 to a video selector and mixer 100 which with corresponding adjustment delivers them via a line 9 to a monitor 10 so that a television picture of the area analysed by the objective 5 is displayed on the screen of the monitor 10.

The output line 7 of the television camera 6 is further connected to the input 201 of the video digitizer 200 which compares the analog video signals with two adjustable threshold values which are adjustable independently of each other with the aid of potentiometers 202, 203. The digitizer 200 produces at its output 204 digital video signals DIGVID A having a high level (white) whenever the analog input signal exceeds the threshold value set at the potentiometer 202 and a low level (black) whenever the analog input signal is below the threshold value. The digitizer 200 has a second output 205 at which it produces another digital video signal DIGVID B which has a high level (white) whenever the analog input signal exceeds the threshold value set at the potentiometer 203 and a low level (black) whenever the analog input signal is below said threshold value. The outputs 204 and 205 of the video digitizer 200 are connected to further inputs of the video selector and mixer 100 which is adjustable by a setting device 101 so that it transmits the digital video signal DIGVID A or the digital video signal DIGVID B selectively to the monitor 10, in each case the normal video signal supplied via the line 8 being simultaneously suppressed. The monitor 10 then displays on its screen a digital video image which consists only of white and black picture elements.

The threshold value for the digital video signal DIGVID A is set by means of the potentiometer 202 so that the video signals originating from the base 54 and thus also from the intermediate spaces 53 all remain below this threshold value whilst the video signals originating from the bars 52 for the major part exceed the threshold value. Thus, in the digital television picture reproduced by means of the signal DIGVID A the bars 52 appear predominantly white whilst the intermediate spaces 53 and the carrier 54 surrounding the slice 51 are displayed completely black.

The threshold value for the digital video signal DIGVID B is set by means of the potentiometer 203 so that the video signals originating from the ink dots 56 remain predominantly below this threshold value whilst the video signals originating from the free areas of the bars 52 for the major part exceed said threshold value. Thus, in the digital video signal reproduced by means of the signal DIGVID B the ink dot 56 is displayed black on a predominantly white background. Since the contrast conditions between the bars 52 and the base 54 on the one hand and between the ink dots 56 and the bars 52 on the other way be different, it is expedient to work with two different threshold values.

The output line 7 of the television camera 6 is further connected to the input 301 of a sync separator 300. The latter separates the frame and line synchronizing pulses from the analog video signals and delivers the frame synchronizing pulses FR and the line synchronizing pulses LN at two separate outputs. The sync separator 300 has a third output at which it furnishes a composite synchronizing signal SYNC which contains both the frame synchronizing pulses and the line synchronizing pulses. This third output is connected to a further input of the video selector and mixer 100 so that the synchronizing signals necessary for the picture display on the monitor 10 are also available when one of the digital video signals DIGVID A or DIGVID B is utilized for the display instead of the normal video signal.

The sync separator 300 has a fourth output at which it furnishes a signal TOP which for the entire duration of a selected frame has a high level and for the duration of lthe other frame a low level. By means of a setting device 302 either the even or the odd frames may be selected for producing the signal TOP; the particular frame selected is used for the marking and evaluation of the television picture explained in detail hereinafter. At a fifth output a short pulse CLR is delivered which coincides with the leading edge of the signal TOP, i.e. with the start of the selected frame.

The output of the sync separator 300 carrying the line synchronizing signal LN is connected to the control input of a picture element generator 11 which furnishes at its output a sequence of picture element pulses PE which define individual picture elements along each television line. The picture element generator is synchronized by the line synchronizing pulse LN so that the picture element pulses PE during the scanning of each television line occur in exactly defined always identical location with respect to the beginning of the television line and thus define picture elements lying vertically below each other in the various television lines. The recurrence frequency of the picture element pulses PE is approximately 9.3 MHz but can be adjusted by means of a setting device 12 for the purpose of an adjustment which will be explained in detail hereinafter.

The outputs of the sync separator 300 and the output of the picture element generator 11 are connected to corresponding inputs of an alignment sequencer 400. Further inputs 401 of the alignment sequencer 400, for simplicity illustrated as a single line, are connected to an input device 402. On the basis of the input signals fed thereto the alignment sequencer 400 generates at eight outputs signals LNX 1, LNX 2, PEX 1, PEX 2, LNG A, LNG B, PEG A and PEG B which occur at predetermined instants and for a fixed duration in each selected frame and are fed on the one hand to a misalignment detector 450 and on the other to a marker generator 500. On the basis of the signals fed thereto the marker generator 500 generates marker signals MK A, MK B, MK C, MK D, which have two signal levels (black and white). It combines these marker signals with a further marker signal MK E supplied thereto from the output of a circuit 600 and forms therefrom a composite marker signal MK A-E which by means of the video selector and mixer 100 can be superimposed on the video signal displayed on the monitor 10 so that on the reproduced television picture white marker lines or marker areas are produced. A further marker signal MK F which can also be superimposed on the displayed video signal is supplied directly to the video selector and mixer 100 from the output of a circuit 700.

The markers displayed on the television screen by means of the marker signals MK A, MK B, MK C, MK D, MK E, MK F are shown more exactly in FIG. 3. The marker signals MK A produce a set A of eight marker lines A7 to A0, each of which occupies a centre portion of a television line. Two successive marker lines of the set A are separated by an interval which corresponds to a television line of the frame (i.e. three television lines of the complete picture). In the same manner the marker signals MK B produce a set B of eight horizontal marker lines B7 to B0 which are completely identical to the marker lines of set A but lie spaced beneath the set A. The marker signals MK C produce a set C of eight vertical marker lines C7 to C0 which extend in the vertical direction above the interval between the lowermost marker line A0 of the set A and the uppermost marker line B7 of the set B but lie to the left outside the area covered by the horizontal marker lines of the sets A and B. Each marker line C has the width of a picture element defined by a picture element pulse PE and two successive vertical marker lines C have a spacing corresponding to two periods of the picture element pulse PE. In the same manner the marker signals MK D produce a set D of eight vertical marker lines D7 to D0 which are completely identical to the lines of the set C but which are spaced from the latter a horizontal distance corresponding to the length of the marker lines A and B. The four marker line sets A, B, C, D thus form a frame enclosing a rectangular area. The television camera 6 is so aligned that the line direction of the television picture corresponds to the X-direction of the X-Y table 2. Accordingly the edges of the particular bar 52 to be aligned lie parallel to the horizontal marker lines A, B and the vertical marker lines C, D respectively. The lengths of the marker lines and the distances between the marker line sets are adjusted so that the rectangular area enclosed by the marker lines corresponds exactly to the size of the television image of a bar. Furthermore, the marker lines assume on the television screen with respect to the imaginary image of the reference point R a location such that the bar is exactly aligned with the reference point R when its image occupies the area enclosed by the marker lines without contacting the innermost marker lines. For example, the image of the reference point R lies exactly in the centre of the rectangle enclosed by the marker lines.

If however the bar 52 is not correctly aligned with the reference point R its image is displaced with respect to the marker lines A, B, C, D so that it covers one or more of the marker lines of one set or of two sets adjoining each other at right-angles. From the number of marker lines covered from the inside towards the outside the magnitude of the necessary correction is apparent and the direction of the correction to be made can be seen from the group to which the covered marker lines belong. This is detected by the misalignment detector 450 which for this purpose, in addition to the output signals of the alignment sequencer 400, receives the marker signals MK A, MK B, MK C, MK D from the marker generator 500 and the digital video signals DIGVID A.

The part of the system of FIG. 1 so far described effects alignment of the bar or of any other object disposed on the X-Y table 2 with respect to the reference point R.

In the production state illustrated in FIG. 2 of semiconductor devices the next manipulation to be carried out with the bars 52 is usually the lifting of all usable bars from the base 54, transferring them to a lead frame and mounting them thereon. This manipulation is for example carried out with the aid of a suction head which is reciprocable between two working stations and comprises a controllable suction nozzle which at one working station picks up one bar and releases said bar at the other working station. The bars are brought in succession to the first working station and the lead frames in succession to the second working station. In this case, alignment of the bar with respect to the reference point R is necessary to ensure that each bar assumes an exactly defined location on its lead frame after the transfer.

It is also required that unusable bars, i.e. in particular incomplete bars disposed at the edge and bars marked with an ink dot, are recognized and not transferred so that they remain on the base 54.

Furthermore, the system should automatically detect the complete passage through a row so that by displacement in the Y-direction by an amount JY the next row can be started on. Finally, it must also be recognized when the end of the slice 51 is reached, i.e. no more bars are present, to enable the processed carrier 50 to be replaced by a new carrier.

These functions are performed by the further circuits illustrated in FIG. 1.

The detection of the presence of an ink dot 56 on the bar disposed in the aligned position is done by means of an ink dot sequencer 600 and an ink dot detector 650. The ink dot sequencer 600 produces the already mentioned marker signal MK E which in the marker generator 500 is added to the marker signals MK A to MK D generated therein so that it is displayed on the screen of the monitor 10 together with said marker signals when the video selector and mixer is correspondingly set.

The marker signal MK E has two signal values (white and black) and produces on the screen of the monitor 10 a rectangular field E which lies within the rectangle enclosed by the marker lines A, B, C, D (FIG. 3). For this purpose, the marker signals MK E in a predetermined number of successive television lines occupy in each case the high signal value (white) for the same predetermined number of successive picture elements. The location of the field E is set so that it covers the area in which an ink dot must lie if it is present on the bar. The size of the field E is set so that a considerable portion of its area is occupied by any ink dot present. The size and location of the field E are determined by digital data supplied to the input 601 of the ink dot sequencer 600 by a control means 602.

The marker signals MK E are also fed to the ink dot detector 650 which at a second input receives the digital video signals DIGVID B. It contains a counter which is controlled by the marker signal MK E so that it counts all the black picture elements which are present in the area of the digital image of the bar covered by the field E. When the count exceeds a predetermined threshold number the ink dot detector 650 furnishes at its output a signal DOT which indicates the presence of an ink dot. The threshold number can be adjusted with the aid of a setting device 651 for adaptation to the sizes occurring of the ink dot. The signal DOT appearing at the output of the ink dot detector 650 is fed also to the displacement control device 14 which when this signal appears controls the X motor 3 so that it displaces the X-Y table 2 by the amount JX (FIG. 2) in the X-direction and thus brings the next bar beneath the television camera 6 for alignment; simultaneously, the displacement control device 14 blocks the manipulation to be carried out on the bar, i.e. in the aforementioned example the removal of the bar by means of the suction head. If, on the contrary, the ink dot detector 650 does not furnish an output signal DOT the necessary operation is carried out on the aligned bar and after completion of said operation a flag signal is supplied to the displacement control device 14 and effects displacement of the X-Y table 2 by the amount JX in the X-direction so that the next bar is brought into the alignment position. These operations are repeated for as long as bars are present in the respective row on the carrier 50 (FIG. 2).

A bar sequencer 700 and a bar detector 750 determine whether a bar is incomplete or missing entirely. This can sometimes occur within a row but applies regularlty to the end of the row at the edge of the slice 51 (FIG. 2). On reaching the end of the row in most cases an incomplete bar is first detected and on further displacement in the X-direction by the amount JX a missing bar. This fact may be utilized to initiate a displacement in the Y-direction by the amount JY and thereafter a displacement in the opposite X-direction until a complete bar is found in the next row.

FIG. 1 indicates that the line synchronizing pulses LN and the picture element pulses PE are also fed to the ink dot sequencer 600 and the bar sequencer 700 in which they are counted for formation of the marker signals MK E and MK F respectively. The same pulses, as also output signals of the alignment sequencer, are also transmitted to other circuits although in FIG. 1 the corresponding connections have been omitted for clarity.

For this purpose the bar sequencer 700 generates the marker signal MK F which is supplied via the video selector and mixer 100 to the monitor 10 and, if the latter is suitably set, effects the display of one or more marker areas within the rectangle enclosed by the marker lines A, B, C, D. The same marker signal MK F is additionally supplied to an input of the bar detector 750 which receives at a second input the digital video signal DIGVID A. The bar detector 750 contains a counter which is controlled by the marker signal MK F so that it counts all the white picture elements which are present in the portions of the digital video image which are covered by the marker areas produced by means of the marker signal MK F. In the simplest case this marker area may be a rectangle occupying almost the entire area of the bar to be aligned; in this case the bar detector 750 would count all the white picture elements of the digital video image of the bar appearing in said area. In a preferred embodiment illustrated in FIG. 3, however, the marker signals MK F produce four small rectangular or square marker fields F1, F2, F3, F4 which lie in the four corners of the area occupied by the image of the correctly aligned bar. In this case the bar detector 750 counts the white picture elements in all four rectangles. In each case the bar detector 750 furnishes at its output a signal BAR whenever the count exceeds a minimum value set with the aid of a setting device 751. If however the count does not reach this fixedly set minimum value then at least one of the four corners of the bar is not present, i.e. the bar is at least incomplete or is missing entirely. The bar detector 750 then does not furnish a signal BAR at the end of the complete frame, which indicates that the bar is missing or incomplete. The signal BAR is fed to the displacement control device 14; when this signal is lacking the X motor 3 is controlled so that it displaces the X-Y table 2 by the amount JX (FIG. 2) in the X-direction to bring the next bar into the alignment position beneath the television camera 6. If even then no signal BAR appears this can be taken as a criterion showing that the end of the row has been reached; the Y motor 4 is then controlled so that it displaces the X-Y table 2 by the amount JY in a predetermined Y-direction (positive or negative) and the displacement direction of the X motor 3 is reversed.

The end of the slice 51 is detected by an end of slice detector 800 which receives at its input the digital video signal DIGVID A and counts all the white picture elements which appear in the entire television picture. If the count remains under a predetermined fixed threshold number, which may be set by means of a setting device 801, this means that the television picture is substantially occupied by the dark background of the base 54, i.e. the end of the slice 51 has been reached. In this case the end of slice detector 800 furnishes at its output a signal EOS which is also supplied to the displacement control device 14. On the basis of this signal the machine is for example stopped and an alarm triggered for the operator so that he can replace the used carrier 50 by a new one.

The more exact makeup of the various circuits contained in the system of FIG. 1 is illustrated in FIGS. 6 to 13. The function of these circuits and the generation of the various signals will be explained in particular with reference to FIGS. 3 and 5.

As already mentioned, the line direction (horizontal sweep direction) of the television picture corresponds to the X-direction and the direction perpendicular thereto (vertical sweep direction) corresponds to the Y-direction. Each point of the television picture can thus be clearly determined by an X coordinate and a Y coordinate. This makes it possible in particular to clearly define the borders of the various marker lines and marker areas on the screen.

In FIG. 3 at the upper edge in the horizontal direction (X-direction) ten X coordinates X1 to X10 are shown.

At the left edge in the vertical direction (Y-direction) ten Y coordinates Y1 to Y10 are shown.

The coordinate X1 indicates the distance of the first marker line C7 of the set 7 from the left image edge (line begin). The coordinate X2 defines the location of the last marker line CO of this set and the start of all the horizontal marker lines of the two sets A and B. The coordinate X3 corresponds to the left edge of the two marker fields F1 and F3 whose right edge is defined by the coordinate X4. The two coordinates X5 and X6 correspond to the left and right edge respectively of the marker field E. The coordinates X7 and X8 indicate the location of the left and right edge respectively of the two marker fields F2 and F4. The coordinate X9 corresponds to the end of the horizontal marker lines A and B and the location of the first vertical marker line D7 of the set D and finally a coordinate X10 indicates the location of the last marker line DO of the set D.

In the same manner the coordinate Y corresponds to the distance of the first horizontal marker line A7 from the upper image edge (start of the frame) and the coordinate Y2 corresponds to the location of the last marker line AO of the set A and the upper end of the vertical marker lines of the two sets C and D. The coordinates Y3 and Y4 indicate respectively the upper and lower edges of the two marker fields F1 and F2, the coordinates Y5 and Y6 respectively the upper and lower edges of the marker field E and the coordinates Y7 and Y8 the upper and lower edges respectively of the two marker fields F3 and F4. The coordinate Y9 corresponds to the lower end of the vertical marker lines C and D and the horizontal marker line B7, and finally the coordinate Y10 denotes the location of the last horizontal marker line B0.

The coordinates X and Y not only denote spatial points on the television picture but also predetermined instants during the scanning of the television picture. Thus, each coordinate Y can be clearly defined by a predetermined number of line synchronizing pulses LN which are counted from the start of the frame (frame synchronizing pulse FR) or from a preceding Y coordinate. Likewise, each X coordinate can be defined by a predetermined number of picture element pulses PE which are counted from the start of the respective television line (line synchronizing pulse LN) or from a preceding X coordinate. By counting the line synchronizing pulses LN and the picture element pulses PE it is thus possible to define exactly each point within the television picture.

The circuits described hereinafter produce in particular predetermined control signals at instants which correspond to predetermined previously defined X coordinates and Y coordinates and they employ these control signals to generate the marker signals.

In FIGS. 4A and 4B, which are to be placed together along the vertical edge, the marker signals MK A, MK B, MK D, MK E and MK F are illustrated in a row of horizontal time axes within the thickly drawn border and each correspond to a television line of the frame used for the marking. At the upper edge various control signals are illustrated which are produced during the scanning of all or some of the television lines and thus substantially recur with the line frequency. Along the vertical left edge control signals are shown which are generated during the scanning of the frame and thus recur with the frame frequency.

FIG. 5 again shows the components 6, 10, 11, 100, 200, 300 of the system of FIG. 1 and in particular clearly indicates the makeup and function of the video selector and mixer 100. The latter comprises a video amplifier and mixer 102 and a video selector 104. The normal video signal supplied via the line 8 is fed to an input 103 of the video amplifier and mixer 102 and transmitted by the latter after amplification via the line 9 to the monitor 10 unless a digital video signal is requested at the video selector 104. The digital video signals DIGVID A DIGVID B are supplied to the inputs 105 and 106 respectively of the video selector 104 which also receives at an input 107 the composite marker signal MK A-E and at an input 108 the marker signal MK F. The video selector 104 further comprises four control inputs 109, 110, 111, 112 which are connected to the setting device 101. The video selector 104 is connected via three output lines 113, 114, 115 to the video amplifer and mixer 102 which also receives at an input 116 the composite synchronizing signal SYNC from the sync separator 300.

If instead of the normal video signal the digital video signal DIGVID A is to be displayed on the monitor 10, by means of the setting device 101 a control signal SDIGVID A is supplied to the control input 109. The video selector 104 then transmits the digital video signal DIGVID A from the input 105 via the output line 113 to the video amplifier and mixer 102 and simultaneously furnishes on the output line 114 a blanking signal BLK which in the video amplifier and mixer 102 blocks the normal video signal supplied to the input 103. In the same manner the digital video signal DIGVID B is displayed on the monitor 10 when a corresponding control signal SDIGVID B is applied by the setting device 101 to the control input 10. The synchronizing signals necessary for displaying the digital video images are available simultaneously at the input 116 of the video amplifier and mixer 102.

By applying a control signal SMK A-E to the control input 111 of the video selector 104 the composite marker signal MK A-E supplied to the input 107 is transmitted via the output line 115 to the video amplifier and mixer 102 and in the latter superimposed on the particular video signal displayed, i.e. either the normal video signal supplied to the input 103 or the digital video signal DIGVID A or DIGVID B transmitted via the line 113. The marker lines A, B, C, D and the marker field E are then displayed on the screen of the monitor 10 superimposed on the displayed video image. By applying a control signal SMK F to the control input 112 said marker signals may also be added to the marker signal MK F supplied to the input 108 so that the four marker fields F1, F2, F3, F4 are also displayed on the screen of the monitor.

The setting device 101 may for example be part of a manually actuated keyboard which on actuation of corresponding keys emits the necessary control signals in the form of signal levels.

The video digitizer 200 includes a pair of threshold comparators 205 and 206 in the form of operational amplifiers which each receive at their non-inverting input the normal video signal furnished by the television camera 6, whilst the inverting input of the threshold comparator 206 is connected to the tap of the potentiometer 202 and the inverting input of the threshold comparator 207 to the tap of the potentiometer 203. In accordance with the usual mode of operation of such threshold comparators each of them furnishes an output signal of low level (black) as long as the analog signal supplied to the non-inverting input remains below the potential across the inverting input, whereas in the opposite case an output signal with high level (white) is furnished. As already mentioned, the potentiometer 202 is set so that the threshold value for the comparator 206 is adapted to the current between the highly reflecting surface of the bar 52 and the weakly reflecting surface of the base 54 or the intervals 53 between the bars whilst the threshold for the comparator 207 is adapted by adjustment of the potentiometer 203 to the contrast between the highly reflecting surface of the bars 52 and the weakly reflecting ink dots 56. The threshold values may be optimally adjusted for the respective particular use by means of the potentiometers 202 and 203.

FIG. 6 shows in greater detail the block circuit diagram of the alignment sequencer 400. The mode of operation of the sequencer 400 will be explained in particular with reference to FIGS. 4A and 4B.

As apparent from FIGS. 4A and 4B the first marker signal MK A7 used for the display of the marker line A7 is generated when during the frame scanning the line denoted by the coordinate Y1 is reached. During the scanning of this line the marker signal MK A7 assumes at the instant corresponding to the coordinate X2 a high level which it retains until the instant X9. The same process repeats itself for the other marker signals MK A6 to MK A0 in every other frame line until the coordinate Y2 is reached, no marker signal MK A being generated in the lines in between.

In the frame line following the coordinate Y2 generation of the marker signals MK C and MK D starts for the display of the vertical marker lines C and D. Since the se marker lines are perpendicular to the television line direction, only one picture element of them can be displayed in each line. The marker signals MK C and MK D thus consist in each frame line of eight successive short pulses with half the frequency of the picture element pulses PE, the eight pulses of the marker signals MK C being generated between the instants X1 and X2 and the eight pulses of the marker signals MK D between the instants X9 and X10. These pulses recur in each frame line until the frame line corresponding to the coordinate Y9 is reached. Between the coordinates Y9 and Y10 in every other frame line the marker signals MK B are then again generated in the same manner as the marker signals MK A.

In each of the television lines lying between the coordinates Y5 and Y6 the marker signal MK E is also generated and assumes a high level from the instant X5 to the instant X6.

When the markers F1, F2, F3, F4 are displayed as well, the marker signal is additionally generated in the television lines between the coordinates Y3 and Y4 and in the television lines between the coordinates Y7 and Y8 and said signal MK F assumes in each television line a high level from the instant X3 to the instant X4 and from the instant X7 to the instant X8.

The marker signals MK A, MK B, MK C and MK D are produced in dependence upon data which define the coordinates X1, X9, Y1 and Y9 and are recorded in a memory 403 (FIG. 6) which has a capacity of four words x eight bits. These data determine the dimensions and location of the rectangle defined by the marker lines and are fed into the input 401 of the memory with the aid of the control means 402 for adaptation to the particular bar to be aligned. The memory word defining the coordinate X1 is the number of the picture element pulses furnished from the start of the line (line synchronizing pulse LN) up to the coordinate X1; the memory word determining the coordinate X2 is the number of the picture element pulses PE emitted between the instants X1 and X2. The memory word determining the coordinate Y1 is the number of line synchronizing pulses LN emitted from the frame start (frame synchronizing pulse FR) up to the instant Y1; the memory word determining the coordinate Y9 is the number of line synchronizing pulses LN emitted between the instants Y1 and Y2.

The memory 402 has an output 404, an address input 405 and an enable input 406. The output 404, which is in fact a multiple output at which the eight bits of a stored word are emitted in parallel, is connected to the preset inputs 409, 410 of two presettable reverse counters 407, 408. The counter 407 receives at its clock input 411 the line synchronizing pulses LN and serves as line counter. The counter 408 receives at its clock input 412 the picture element pulses PE and serves as picture element counter. The line counter 407 also has a preset control input 413 and two outputs 414, 415; the picture element counter 408 has a preset control input 416 and two outputs 417, 418.

The address input 405 and the enable input 406 of the memory 403 are connected to two outputs of a memory address and strobe decode 419 which at a trigger input 420 receives the frame synchronizing pulses FR and at a further trigger input 421 the line synchronizing pulses LN. A further trigger input 422 is connected to the output 414 of the line counter 407 and a fourth trigger input 423 is connected to the output 417 of the picture element counter 408. The memory address and strobe decode 419 has two further outputs 424 and 425 which are connected to the preset control input 413 of the line counter 407 and to the preset control input 416 of the picture element counter 408 respectively.

The outputs 414 and 415 of the line counter 407 are connected to two inputs of an A/B latch 426 which has two complementary outputs 427, 428, and the outputs 417, 418 of the picture element counter 408 are connected to two inputs of a C/D latch 429 which has two complementary outputs 430, 431.

With each frame synchronizing pulse FR supplied to the input 420 of the memory address and strobe decode 419 the memory is addressed and driven so it furnishes at its output 404 the first memory word which in the previously outlined manner indicates the coordinate Y1 in the form of a redetermined line number. An enable pulse emitted simultaneously at the output 424 of the memory address and strobe decode 419 and supplied to the preset control input 413 of the line counter 407 effects that said counter is preset to the number provided by the memory. The leading edge of the frame synchronizing pulse FR effects the addressing of the memory 403 whilst its trailing edge initiates the transfer of the memory word read to the counter. The same also applies to the other trigger pulses supplied to the inputs 421, 422, 423 of the memory address and strobe decode 419.

The line counter 407 is advanced by the line pulses LN supplied to its clock input 411 so that its content is reduced by one unit for each line pulse. As soon as it has reached zero count it emits at its output 414 a pulse LNX 1. This pulse therefore coincides with the start of the line denoted by the coordinate Y1 (FIG. 4A). The pulse LNX 1 is also supplied to the trigger input 422 of the memory address and strobe decode 419 and in the manner outlined above results in the addressing and emission of the memory word from the memory 403 which represents the coordinate Y2 by the number of lines lying between the coordinates Y1 and Y2. The line counter 407 is preset to this number and again counted down by the line synchronizing pulses LN supplied to its clock input 411. When it has reached zero count it emits at its output 415 a pulse LNX 2 which thus coincides with the start of the line corresponding to the coordinate Y2 (FIG. 4A). This operation is repeated in each frame so that during the scanning of each frame a pulse LNX 1 and a pulse LNX 2 appears.

The memory is addressed and interrogated by the first line synchronizing pulse LN appearing after the frame synchronizing pulse FR in such a manner that said memory transmits to the picture element counter 408 a memory word which in the previously explained manner represents the coordinate X1 by a number of picture elements. The picture element counter 408 is counted down by the picture element pulses PE supplied to its clock input 412 and on reaching zero count furnishes at its output 417 a pulse PEX 1 which thus occurs during the scanning of a line at the instant corresponding to the coordinate X1 (FIG. 4A). The pulse PEX 1 is also applied to the trigger input 423 of the memory address and strobe decode 419 and as a result the memory 403 transfers to the picture element counter 408 the memory word which defines the coordinate X9 by the number of picture elements lying between X1 and X9. The picture element counter is again counted down by the picture element pulses PE and on reaching zero count furnishes at the output 418 a pulse PEX 2 which during the line scanning occurs at the instant corresponding to the coordinate X9. The same operation is initiated by each following line pulse LN so that in each line of the frame a pulse PEX 1 and a pulse PEX 2 are generated.

The pulse LNX 1 applied from the output 414 of the line counter 407 to the A/B latch 426 brings the latter into a position in which the potential at the output 427 assumes a high level and simultaneously the potential at the complementary output 428 assumes a low level. The pulse LNX 2 furnished at the output 415 of the line counter 407 brings the A/B latch 426 into the other position in which the potential at the output 427 is low and the potential at the output 428 is high. The A/B latch 426 thus furnishes at the output 427 a signal LNG A which in each frame has a high level between the coordinates Y1 and Y9 and a low level in the other part of the frame. Correspondingly, the signal LNG B complementary thereto at the output 428 has from the coordinate Y9 of a frame to the coordinate Y1 of the next frame a high level but a low level between the coordinates Y1 and Y9 of each frame.

In the same manner the pulses PEX 1 and PEX 2 supplied to the C/D latch 429 effect that the signal PEG A (FIG. 4) furnished at the output 430 has a high level in each line between the coordinates X1 and X9 and a low level in the remaining portion of the line whilst the complementary signal PEG B furnished at the output 431 has a high level from the coordinate X9 of a line to the coordinate X1 of the following line and a low level between the coordinates X1 and X9.

The misalignment detector 450 illustrated in FIG. 7 includes a line address counter 452 in the form of a three-stage binary counter with two preset inputs to which the signals LNX 1 and LNX 2 respectively are supplied by the outputs 414, 415 of the alignment sequencer 400 (FIG. 6). The clock input of the line address counter 452 is connected to the output of a frequency divider 453 to which the line synchronizing pulses LN are supplied and which furnishes at its output pulses having half the recurrence frequency of the line synchronizing pulses LN. The line address counter 452 has an output group 454 having three outputs which are the stage outputs of the three binary counter stages. Thus, at the outputs 454 a group of binary signals appears which express the particular count of the line address counter 452 in the form of a three-digit binary number between 0 and 7. The line address counter 452 is so designed that it is reset to the count 7 by each pulse LNX 1 or LNX 2 supplied to the reset input and then counted down by the pulses supplied to its clock input with half the recurrence frequency of the line synchronizing pulses. For the entire duration of the counting from the start of the presetting until zero count has been reached the line address counter 452 furnishes at a further output 455 a signal LNCT of high level (FIG. 5). This signal LNCT is applied to an enable input of the frequency divider 453 so that the latter emits output pulses only whilst this signal LNCT obtains. Thus, after each presetting by a signal LNX 1 or LNX 2 at the output of the frequency divider 453 a group of eight clock pulses AB-CLK appears with half the recurrence frequency of the line synchronizing pulses LN and the line address counter remains stationary after reaching zero count until the next presetting by a signal LNX 1 or LNX 2. The signal LNCT and the pulse groups AB-CLK emitted for its duration by the output of the frequency divider 453 are also supplied to other points of the circuit as indicated by arrows.

Thus, in the course of each frame the signal LNCT extends from the coordinate Y1 to the coordinate Y2 (LNCT 1) and from the coordinate Y9 to the coordinate Y10 (LNCT 2).

In corresponding manner the misalignment detector 450 includes a picture element address counter 456 with two preset inputs which receive the signals PEX 1, PEX 2 from the outputs 417, 418 of the alignment sequencer 400 (FIG. 6) and a clock input which is connected to the output of the frequency divider 457 which receives the picture element pulses PE and furnishes clock pulses with half the recurrence frequency of the picture element pulses PE. The picture element address counter 456 is made up in the same manner as the line address counter 452; it is thus set to the count 7 by each of the pulses PEX 1 and PEX 2 and thereafter counted down until zero count is reached by the clock pulses with half the recurrence frequency of the picture element pulses PE. During this counting it furnishes at a group 458 of three outputs, which are the outputs of the binary counter stages, binary pulse groups which indicate the respective count in the form of a three-digit binary number. At a further output 459 for the entire duration of the counting a signal PECT is furnished. The signal PECT is present in each picture line between the coordinates X1 and X2 (PECT 1) and between the coordinates X9 and X10 (PECT 2). The remaining parts of FIG. 7 are associated with the alignment functions of the apparatus which are described in detail in parent applicaion Ser. No. 948,064.

FIG. 9 shows the circuits for the ink dot recognition, consisting of the ink dot sequencer 600 and the ink dot detector 650.

The ink dot sequencer 600 includes a memory 603 having a capacity of four words x 8 bits. With the aid of the control means 602 connected to the input 601 data can be fed into the memory 603 in accordance with the location and size of the ink dot 56 on the bars 52 to be processed (FIG. 2), said data defining the borders Y5, Y6, X5, X6 of the marker field E by the numbers of the lines to be counted in the frame and picture elements to be counted in each line. The memory 603 has an output 604, an address input 605 and an enable input 606.

The output 604 is connected to the preset inputs of a line counter 607 and a picture element counter 608. The line counter 607 receives at its clock input the line synchronizing pulses LN and the picture element counter 608 receives at its clock input the picture element pulses PE. The addresss input 605 and enable input 606 of the memory 603 are connected to two outputs of a memory address and strobe decode 609 which receives at two trigger inputs the signals LNCT and PECT and at two enable inputs the signals LNG A and PEG A. Two further trigger inputs of the memory address and strobe decode 609 are connected to the output 610 of the line counter 607 and the output 611 of the picture element counter 608, and two further outputs of the memory address and strobe decode 609 are connected to the preset control inputs of the two counters 607, 608.

The circuits 603, 607, 608, 609 described are identical to the circuits 403, 407, 408 and 419 of FIG. 7 and are connected together in a manner very similar to the latter. The mode of operation is also substantially the same. The only differences are as follows: The first input of a memory word into the line counter 607 is initiated in each frame by the signal LNCT during the existence of the signal LNG A and said memory word indicates the number of the frame lines to be counted from the trailing edge of the signal LNCT up to the coordinate Y5. The line counter 607 counts down from this preset number and on reaching zero count emits a pulse EMLN 1 at the output 610. This pulse thus indicates the frame line corresponding to the coordinate Y5 in which the upper limit of the marker field E (FIG. 3) lies. The same pulse is supplied to a trigger input of the memory address and strobe decode 609 and initiates the transfer of the second memory word to the line counter 607, which indicates the number of frame lines to be counted between the coordinates Y5 and Y6. The line counter 607 counts down from this new presetting and on reaching zero count furnishes at the output 610 a further pulse EMLN 2 which indicates the frame line with the coordinate Y6 in which the lower border of the marker field E lies.

In corresponding manner, in each frame line the introduction of the third memory word into the picture element counter 608 is initiated by the signal PECT during the existence of the signal PEG A, said memory word indicating the number of picture elements to be counted from the end of the signal PECT up to the coordinate X5. On reaching zero count the picture element counter 608 furnishes at the output 611 a pulse EMPE 1 which coincides with the coordinate X5 and thus corresponds to the left border of the marker field E. This pulse initiates the introduction of the fourth memory word into the picture element counter 608 which indicates the number of picture elements to be counted between the coordinates X5 and X6. On reaching zero count the picture element counter 608 furnishes a further pulse EMPE 2 which thus corresponds to the right border of the marker field E. This operation is repeated in each frame line during the existence of the signal LNG A.

It should be noted that the operations described take place in every frame, i.e. not only in every other frame selected by the signal TOP.

The feature described of counting the line and picture elements from the signals LNCT and PECT onwards respectively instead of from the frame beginning and line beginning has the advantage that the words to be recorded in the memory can be fixed once and for all for each bar type, irrespective of the locations of the markers on the television picture.

It is therefore possible to displace the markers on the television picture as desired without having to change the memory words for the marker field E.

The outputs 610 and 611 of the line counter 607 and the picture element counter 608 respectively are connected to the two inputs 613, 614 of an E marker generator 612. The latter is so designed that it is brought into the operative position by each pulse EMLN 1 supplied to the input 613 and returned to the inoperative position by each pulse EMLN 2. In the operative position each pulse EMPE 1 applied to the input 614 brings the output signal at the output 615 to the high signal level (white) which is also retained even after the end of the pulse EMPE 1, and each pulse EMPE 2 resets the output signal to the low signal level again. It is immediately apparent from FIG. 5 that the signals obtained in this manner at the output 615 are the marker signals MK E. These are supplied on the one hand to the input of the ink dot detector 650 and on the other to the OR circuit 511 in the marker generator 500 (FIG. 8).

The ink dot detector 650 includes an ink dot control 652 which receives at an input 653 the marker signals MK E, at a further input 654 the digital video signals DIGVID B and at a third input 655 the picture element pulses PE. The ink dot control 652 performs an AND-gating of the three input signals, the digital video signal DIGVID B being inverted at the input 654. It thus emits at its output 656 an output signal for each pulse PE supplied in the course of the marker signals MK E if simultaneously the digital video signal DIGVID B has the low signal level (black). The output pulses of the ink dot control 652 thus correspond to the black picture elements, contained in the marker field E, of the digital video image represented by means of the signal DIGVID B.

The output 656 of the ink dot control 652 is connected to the input of a pulse frequency divider 657 whose division factor is adjustable by means of a setting device 658 to different values, for example to the values 1:1, 5:1, 10:1, 50:1. Connected to the output of the pulse frequency divider 657 is a counter 659 which thus counts the number of the black picture elements of the signal DIGVID B present in the marker field E divided by the set division factor of the pulse frequency divider 657.

The stage outputs of the counter 659 are connected to one input group of a comparator 660, at the other input group of which any desired binary number can be set with the aid of the setting device 651. As soon as the comparator 660 detects identity of the count reached in the counter 659 and the set number it furnishes at the output 661 a signal which brings the ink dot latch 662 into the operative position until it is returned to the inoperative state by the next pulse CLR, and said latch furnishes in the operative state at its output the signal DOT which indicates the presence of an ink dot on the analysed bar. The counter 659 is enabled by the signal TOP and on completion thereof reset to zero.

The sensitivity of the ink dot detector can be set by adjusting the division factor of the pulse frequency divider 657 by means of the setting device 658. The threshold number is set by means of the setting device 651 in adaptation to the magnitude fluctuations of the ink dot to be expected so that the number of black picture elements counted is with certainty above the threshold number even for the smallest ink dot which occurs.

FIG. 10 shows the bar recognition circuit comprising the bar sequencer 700 and the bar detector 750. The latter contains two circuit groups which have the same makeup and mode of operation as the circuit group consisting of the circuit 603, 607, 608 and 609 of FIG. 11. The first circuit group consists of the memory 703, the line start counter 704, the picture element start counter 705 and the memory address and strobe decode 706. The second circuit group consists of the memory 713, the line stop counter 714, the picture element stop counter 715 and the memory address and strobe circuit 716. The only difference in the mode of operation results from the meaning of the words which are fed into the memories 703 and 713 at the input 701 with the aid of the control means 702:

The first memory word of the memory 703, which is introduced into the line start counter 704 in each frame under the control of the signals LNG A and LNCT for presetting, causes on reaching zero count a pulse FMLN 1A to be emitted at the output 707 of the counter 704; this pulse (FIG. 4A) defines the coordinate Y3 of the upper border of the marker fields F1 and F2 (FIG. 3).

The second memory word of the memory 703, which is introduced into the line start counter 704 in each frame under the control of the pulse FMLN 1A for presetting, causes on reaching zero count a pulse FMLN 1B to be emitted at the output 707; this pulse (FIG. 4B) defines the coordinate Y7 of the upper border of the marker fields F3 and F4 (FIG. 3).

The third memory word of the memory 703, which is introduced into the picture element start counter 707 in each frame line under the control of the signals PEG A and PECT for presetting, causes on reaching zero count a pulse FMPE 1A to be emitted at the output 708 of the counter 705; this pulse defines the coordinate X3 of the left border of the marker fields F1 and F3.

The fourth memory word of the memory 703, which is introduced into the picture element start counter 705 in each frame line under the control of the signal FMPE 1A for presetting, causes on reaching zero count a pulse FMPE 1B to be emitted at the output 708; this pulse defines the coordinate X7 of the border of the marker fields F2 and F4.

The first memory word of the memory 713, which is introduced into the line stop counter 714 in each frame under the control of the signals LNG A and LNCT for presetting, causes on reaching zero count a pulse FMLN 2A to be emitted at the output 717 of the counter 714; this pulse defines the coordinate Y4 of the lower border of the marker fields F1 and F2.

The second memory word of the memory 713, which is introduced into the line stop counter 714 in each frame under the control of the pulse FMLN 2A for presetting, causes on reaching zero count a pulse FMLN 2B to be emitted at the output 717; this pulse defines the coordinate Y8 of the lower border of the marker fields F3 and F4.

The third memory word of the memory 713, which is introduced into the picture element stop counter 715 in each frame line under the control of the signals PEG A and PECT for presetting, causes on reaching zero count a pulse FMPE 2A to be emitted at the output 718 of the counter 715; this pulse defines the coordinate X4 of the right border of the marker fields F1 and F3.

The fourth memory word of the memory 713, which is introduced into the picture element stop counter 715 in each frame line under the control of the pulse FMPE 2A for presetting, causes on reaching zero count a pulse FMPE 2B to be emitted at the output 718; this pulse defines the coordinate X8 of the right border of the marker fields F2 and F4.

The outputs 707, 708, 717, 718 of the four counters 704, 705, 714, 715 are connected to inputs of an F marker generator 720 which also receives at further inputs the signals LNG A, LNCT, LN, PEG A, PECT, PE which are required as control signals in the formation of the marker signals MK F. The mode of operation of the F marker generator 720 may be described in simplified manner as follows: The F marker generator is brought into an operative condition by each pulse FMLN 1 (FMLN 1A or FMLN 1B) and returned to the inoperative position by each pulse FMLN 2 (FMLN 2A or FMLN 2B). In the inoperative position the output signal at the output 721 is always at the lower signal level (black). In the operative condition each pulse FMPE 1 (FMPE 1A or FMPE 1B) brings the output signal to the high signal level which it also retains when the pulse FMPE 1 ceases, and each pulse FMPE 2 (FMPE 2A or FMPE 2B) returns the output signal to the low signal level. It is immediately apparent that the signals obtained in this manner at the output 721 of the F marker generator 720 represent the desired marker signals MK F. These signals are supplied on the one hand to the video selector and mixer 100 (FIG. 5) for displaying the marker fields F1 to F4 on the screen and on the other hand are applied to the input of the bar detector 750.

The bar detector 750 includes a bar control 752 which receives at one input the marker signals MK F and at another input the digital video signal DIGVID A. The picture element pulses PE and the signal TOP are applied to further inputs of the bar control 752. The bar control 752 conducts an AND gating of its input signals; consequently, it furnishes in each frame selected by the signal TOP during the existence of a marker signal MK F for each picture element pulse PE an output pulse if simultaneously the digital video signal DIGVID A has a high signal level (white). The pulses furnished by the bar control 752 thus correspond to the number of white picture elements which are present in the corner regions covered by the marker fields F1 to F4 of the digital video image displayed by means of the signal DIGVID A.

The output pulses of the bar control 752 are fed to a pulse counter 753 which is enabled by the signal TOP in the frames selected for the marking and analysis and reset to zero at the end of said signal. The pulse counter 753 has a plurality of outputs at which it furnishes a pulse on reaching certain counts. For example, one output may correspond to the count 50, a further output to the count 250 and a third output to the count 2500.

By means of the setting device 751 one of these outputs can be connected selectively to the input of a bar latch 754 which is brought into the operative condition by the output pulse of the pulse counter 753 and retains this condition until it is reset to the inoperative position by the next pulse CLR. In the operative position the bar latch 754 furnishes a signal BAR at its output. The signal BAR thus indicates that the total number of white picture elements in the corner areas of the digital video image corresponding to the four marker fields F1 to F4 has exceeded the threshold number set by means of the setting device 751; this fact is considered a criterion for the presence of a complete bar. If the signal BAR is missing after complete analysis of the frame this means that the bar is damaged or missing. As previously explained in this case the displacement control device 14 effects a search for a new bar by indexing in the X or Y direction.

FIG. 11 shows the end of slice detector 800. The latter contains an end of slice control 802 which receives at one input the digital video signals DIGVID A, at a second input the pulses PE and at a third inverting input the line synchronizing pulses LN. It conducts an AND gating of its input signals so that for each pulse PE it furnishes a pulse at the output if simultaneously the digital video signal DIGVID A has the high signal level (white). The output pulses of the end of slice control 802 thus correspond to the total number of white picture elements which are present in the entire digital video image displayed by means of the signal DIGVID A. These pulses are counted in a pulse counter 803 which has a plurality of outputs at which it furnishes a pulse on reaching certain counts; for example, one output may correspond to the count 2500 and a further output to the count 12 500. The pulse counter 803 is enabled by the signal TOP in the frames intended for the marking and analysis and reset to zero on completion of said signal. By means of the setting device 801 one of its outputs can be connected selectively to the input of an end of slice latch 804 which is brought into the operative position by the pulse emitted when the selected count is exceeded and retains said position until it is reset to the inoperative position by the next pulse CLR. In the inoperative position the end of slice latch furnishes at a negated output a signal EOS which disappears when the latch goes over to the operative condition. The presence of the signal EOS at the end of the complete scanning of the frame thus means that the number of white picture elements set is not present in the entire frame; this fact is taken as a criterion indicating that all the rows of bars on the carrier 50 have been run through and only the empty base 54 is now being scanned. On the basis of the signal EOS the displacement control device 14 stops the machine and alarms the operator so that he can replace the used carrier 50 by a new one.

FIG. 12 shows a more exact circuit diagram of the video digitizer 200 and indicates how a signal obtained by peak detecting of the video signal is used to adjust the threshold voltages so that the digital video signals DIGVID A and DIGVID B are substantially independent of intensity fluctuations of the video image from which they are generated.

FIG. 13 shows a more exact circuit of the line counter 407 of FIG. 7. The picture element counter 408 is similarly constructed except that the input signals LN and $\overline{FR}$ of FIG. 15 are replaced by the input signals PE and $\overline{LN}$ respectively, and that instead of the output signals $\overline{LNX\,1}$ and $\overline{LNX\,2}$ of FIG. 13 the output signals $\overline{PEX\,1}$ and $\overline{PEX\,2}$ respectively are emitted.

FIG. 14 shows various parts of the block circuit diagrams of FIGS. 6 and 7. From the alignment sequencer 400 of FIG. 6 the A/B latch 426 is shown which is formed by a flip-flop of the type SN 7474 which furnishes at its two complementary outputs Q and $\overline{Q}$ the signals LNG A and LNG B respectively. The C/D latch 429 is constructed in the same manner with a flip-flop of the type SN 74S74 and furnishes the signals PEG A and PEG B.

The line address counter 452 includes a synchronous-bit up-down counter of the type SN 74193 which furnishes at its three outputs A, B, C the three address bits and at a fourth output BW the signal LNCT. The frequency divider 453 is a flip-flop of the type SN 7474 whose clock input CLK (terminal 3) receives the line synchronizing pulses LN and whose clear input C receives the signal LNCT inverted. In corresponding manner the picture element address counter 456 includes a 4 bit up-down counter of the type SN 74 193 which furnishes at three outputs A, B, C the three address bits and at a fourth output BW the signal PECT. The frequency divider 457 is a flip-flop of the type SN 74S74 which receives at its clock input CLK the picture element pulses PE and to the clear input of which the signal PECT is applied inverted.

The remaining components shown in FIG. 14 are associated with the alignment functions of the apparatus which are described in the parent application Ser. No. 948,064.

FIGS. 15 and 16 show some parts of the ink dot sequencer 600 of FIG. 11 in greater detail. As apparent from FIG. 15, the memory address and strobe decode 609 and the E marker generator 612 include flip-flops of the type 74LS74 and associated gating circuits; the marker signals MK E are obtained at the output of a NAND circuit of the type SN 4931 (after inversion). FIG. 16 shows the line counter 607 and the picture element counter 608. Each of these counters is formed by a pair of 4 bit counters of the type SN 74LS193, the output BW of the one counter being connected to the clockdown input of the other counter whose output BW then forms the output 610 and 611 (FIG. 9) respectively which provides the pulses EMLN or EMPE in the manner illustrated in FIG. 4. Furthermore, in FIG. 16 the memory 603 is shown and is formed by a pair of memory registers of the type 74LS670.

What is claimed is:

1. Apparatus for recognizing the presence of an identification area having a first reflection characteristic on a background surface of an object having a second reflection characteristic, comprising television camera means operable to generate an electrical video signal representative of a video image of a surface area of the object containing the identification area; digitizing means for receiving the video signals and forming therefrom digital video signals having two signal levels which for the video signals originating from the background area have predominantly a first signal level and for the video signals originating from the identification area have predominantly a second signal level; marker generator means operable under control of control signals for generating marker signals which define the boundaries of a predetermined number of intervals provided for analysis of said digital video signals; means for analyzing the digital video signals at a predetermined number of instants during said intervals for generating a count pulse in each case when the analyzed digital video signal has the second signal level; and means for counting the count pulses and for furnishing a signal indicating the presence of the identification area whenever said count exceeds a predetermined value during a complete analysis.

2. Apparatus according to claim 1, wherein said digitizing means includes threshold comparator means for receiving at one input the video signals and at the other input an adjustable threshold signal and for emitting digital output signals of the first and second signal levels respectively whenever the video signal lies above and below said threshold value.

3. Apparatus for recognizing the presence of an identification area having a first reflection characteristic on a background surface of an object having a second reflection characteristic, comprising television camera means operable to generate an electrical video signal representative of a video image of a surface of the object containing the identification area by scanning said surface in a line raster; digitizing means for receiving the video signals and forming therefrom digital video signals having two signal levels which for the signal levels originating from the background area have predominantly a first signal level and for the video signals originating from the identification area have predominantly a second signal level; marker generator means operable under control of control signals for generating marker signals which define the boundaries of intervals in a predetermined number of scanned lines provided for analysis of said digital video signals; means for analyzing the digital video signals at a predetermined number of instants during said intervals and for generating in a count pulse in each case when the analyzed digital video signal has the second signal level; pulse generator means for furnishing in the course of each television line scan a sequence of picture element pulses whose frequency is high with respect to the line scan frequency and which determine the instants of the analysis of said digital video signals; and means for counting the count pulses and for furnishing a signal indicating the presence of the identification area whenever the count exceeds a predetermined value during a complete analysis.

4. Apparatus according to claim 3, including sequencer means for receiving line synchronizing pulses from said television camera means and said picture element pulses and in which numerical values may be set which characterize the scanned lines and the instants in each scanned line at which the digital video signal is generated; and means for counting the line synchronizing pulses and the picture element pulses for generating control signals which have time locations in each scanned raster determined by the numerical values set in said sequencer means.

5. Apparatus according to claim 3, including control circuit means for receiving the marker signals, the digital video signals and the picture element pulses and for each picture element pulse occurring during the interval defined by each marker signal furnishing an output pulse whenever the digital video signals simultaneously has said second signal level, and pulse counter means having a count input connected to the output of said control circuit.

6. Apparatus according to claim 5, including frequency divider means having an adjustable division factor connected between the output of the control circuit and the count input of the pulse counter means.

7. Apparatus according to claim 5 or 6, including comparator means having first and second groups of inputs and an output; means connecting outputs of the pulse counter indicating the count to the first group of inputs of said comparator means; and means for applying to the second group of inputs, digital signals which represent a threshold number, said comparator means for furnishing at the comparator output a signal when the count of said pulse counter reaches the threshold number.

8. Apparatus according to claim 7, including latch means connected to the output of the comparator means for actuation by the output signal of the comparator means from an inoperative state into an operative state furnishing an output signal indicating the presence of the identification area.

9. Apparatus for recognizing the presence of an object disposed in the field of view of a television camera on a background surface, the television camera operable to generate an electrical video signal representative of a video image of a surface of the object and of said background surface within the field of view of the television camera, comprising digitizing means for receiving the video signals and forming therefrom digitial video signals of two signal levels which for video signals originating from the object surface have predominantly a first signal level and for video signal originating from the background surface area have the second level; marker generator means operable under control of control signals for generating marker signals to define the boundaries of interfals corresponding to at least marker field lying within the area of the video image of said object; analyzing means for analyzing the digital video signals at predetermined instants during the intervals corresponding to said at least one marker field for producing a pulse in each case the analyzed digital video signal has the first signal level; and by means for counting the pulses and for furnishing a signal indicating the presence or completeness of the object whenever the count exceeds a predetermind value during a complete anaylsis of said at least one marker field.

10. Apparatus according to claim 9, wherein the marker generator means generates marker signals defining the boundaries of intervals for a single marker field approximating to the area of the video image of the object; and means for furnishing a signal indicating the lack of an object in the marker field whenever said count does not reach a predetermined value during a complete analysis of the marker field.

11. Apparatus according to claim 1, 3 or 9, including display means for receiving said video signals and displaying a video image represented by said video signals, and means for superimposing the marker signals on the video image supplied by the television camera for displaying the or each marker area by said display means.

12. Apparatus according to claim 9, wherein the marker generator means generates marker signals defining the boundaries of intervals for a plurality of spaced apart marker fields corresponding to areas within the area of the video image of the object, and said analyzing means for analyzing the digital video signals at predetermined instants during the intervals corresponding to each of said marker fields.

\* \* \* \* \*